United States Patent
More et al.

(10) Patent No.: US 12,249,650 B2
(45) Date of Patent: *Mar. 11, 2025

(54) FinFET DEVICE AND METHODS OF FORMING THE SAME

(71) Applicant: Taiwan Semiconductor Manufacturing Co., Ltd., Hsinchu (TW)

(72) Inventors: Shahaji B. More, Hsinchu (TW); Cheng-Han Lee, New Taipei (TW); Shih-Chieh Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/185,602

(22) Filed: Mar. 17, 2023

(65) Prior Publication Data

US 2023/0223477 A1 Jul. 13, 2023

Related U.S. Application Data

(60) Continuation of application No. 17/121,186, filed on Dec. 14, 2020, now Pat. No. 11,626,518, which is a (Continued)

(51) Int. Cl.
*H01L 29/08* (2006.01)
*H01L 21/225* (2006.01)
(Continued)

(52) U.S. Cl.
CPC ........ *H01L 29/785* (2013.01); *H01L 21/2251* (2013.01); *H01L 21/76829* (2013.01);
(Continued)

(58) Field of Classification Search
None
See application file for complete search history.

(56) References Cited

U.S. PATENT DOCUMENTS

| 6,150,243 A | 11/2000 | Wieczorek et al. |
| 7,235,469 B2 | 6/2007 | Okayama et al. |

(Continued)

FOREIGN PATENT DOCUMENTS

| CN | 101032009 A | 9/2007 |
| CN | 104952922 A | 9/2015 |

(Continued)

*Primary Examiner* — Long Pham
(74) *Attorney, Agent, or Firm* — Slater Matsil, LLP

(57) ABSTRACT

A semiconductor device includes a substrate; a fin protruding above the substrate, the fin including a compound semiconductor material that includes a semiconductor material and a first dopant, the first dopant having a different lattice constant than the semiconductor material, where a concentration of the first dopant in the fin changes along a first direction from an upper surface of the fin toward the substrate; a gate structure over the fin; a channel region in the fin and directly under the gate structure; and source/drain regions on opposing sides of the gate structure, the source/drain regions including a second dopant, where a concentration of the second dopant at a first location within the channel region is higher than that at a second location within the channel region, where the concentration of the first dopant at the first location is lower than that at the second location.

20 Claims, 27 Drawing Sheets

Related U.S. Application Data division of application No. 16/177,072, filed on Oct. 31, 2018, now Pat. No. 10,868,183.

(51) Int. Cl.

| | |
|---|---|
| *H01L 21/768* | (2006.01) |
| *H01L 21/8238* | (2006.01) |
| *H01L 27/092* | (2006.01) |
| *H01L 29/10* | (2006.01) |
| *H01L 29/161* | (2006.01) |
| *H01L 29/423* | (2006.01) |
| *H01L 29/66* | (2006.01) |
| *H01L 29/78* | (2006.01) |

(52) U.S. Cl.
CPC .. *H01L 21/823821* (2013.01); *H01L 27/0924* (2013.01); *H01L 29/0847* (2013.01); *H01L 29/1033* (2013.01); *H01L 29/161* (2013.01); *H01L 29/42356* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 7,323,710 B2 | 1/2008 | Kim et al. |
| 8,815,702 B2 | 8/2014 | Oh et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,343,300 B1 | 5/2016 | Jacob et al. |
| 9,362,311 B1 | 6/2016 | Suk et al. |
| 9,520,482 B1 | 12/2016 | Chang et al. |
| 9,576,814 B2 | 2/2017 | Wu et al. |
| 9,590,031 B2 | 3/2017 | Xiao et al. |
| 10,964,697 B2 | 3/2021 | Ghani et al. |
| 11,450,757 B2 | 9/2022 | Lin et al. |
| 2007/0221956 A1 | 9/2007 | Inaba |
| 2015/0228648 A1 | 8/2015 | Chi et al. |
| 2015/0318211 A1 | 11/2015 | Guo et al. |
| 2016/0149007 A1 | 5/2016 | Chou et al. |
| 2018/0145076 A1 | 5/2018 | Wang et al. |
| 2018/0219093 A1 | 8/2018 | Chou et al. |
| 2019/0348501 A1 | 11/2019 | Glass et al. |
| 2020/0127122 A1* | 4/2020 | Lee ............... H01L 29/0847 |
| 2020/0135913 A1* | 4/2020 | More ............. H01L 29/0847 |

FOREIGN PATENT DOCUMENTS

| | | |
|---|---|---|
| CN | 105431929 A | 3/2016 |
| CN | 108122776 A | 6/2018 |
| JP | 2006100599 A | 4/2006 |
| JP | 2007258485 A | 10/2007 |
| KR | 20050011455 A | 1/2005 |
| KR | 20060013122 A | 2/2006 |
| KR | 20160140973 A | 12/2016 |
| KR | 20170011938 A | 2/2017 |
| WO | 2014018181 A | 1/2014 |
| WO | 2018182748 A1 | 10/2018 |

\* cited by examiner

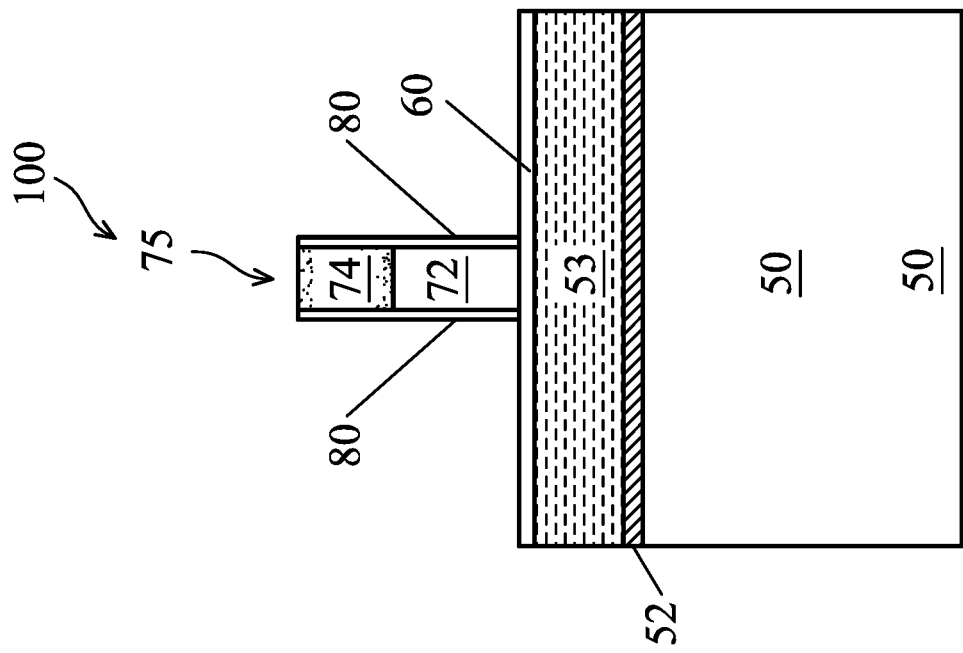
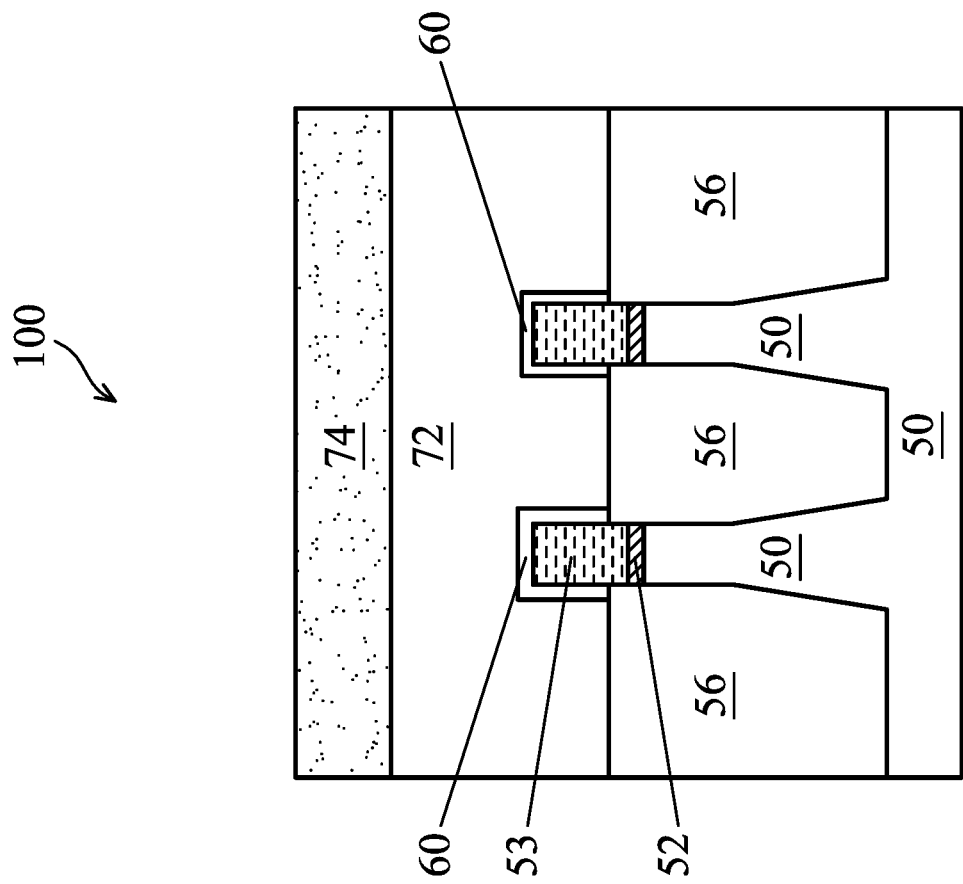

1000

1010 — form a fin protruding from a substrate, the fin being formed of silicon germanium, wherein a concentration of germanium in the fin varies along a first direction from an upper surface of the fin toward the substrate

1020 — form a gate over a channel region of the fin, wherein a concentration of germanium in the channel region increases from a first location of the channel region to a second location of the channel region, wherein the first location and the second location are aligned along the first direction

1030 — form a doped source/drain region in the fin and adjacent to the gate, wherein a dopant of the doped source/drain region diffuses into the channel region of fin, wherein a concentration of the dopant in the channel region varies along the first direction, wherein the concentration of the dopant decreases from the first location of the channel region to the second location of the channel region

FinFET DEVICE AND METHODS OF FORMING THE SAME

PRIORITY CLAIM AND CROSS-REFERENCE

This application is a continuation of Ser. No. 17/121,186, filed Dec. 14, 2020 and entitled "FinFET Device and Methods of Forming the Same," which is a divisional of U.S. patent application Ser. No. 16/177,072, filed on Oct. 31, 2018 and entitled "FinFET Device and Methods of Forming the Same," now U.S. Pat. No. 10,868,183, issued Dec. 15, 2020, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11-14, 15A, 15B, 16A, 16B, 17A, 17B, 17C, 17D, 18A, 18B, 19A, 19B, 20A, 20B, 21A, 21B, 22A, 22B, 23A, and 23B are cross-sectional views of intermediate stages in the manufacturing of the FinFET device 100 following the processing of FIG. 5, in accordance with an embodiment.

FIG. 26 illustrates a flow chart of a method for forming a semiconductor device, in accordance with some embodiments.

DETAILED DESCRIPTION

Figure 1:
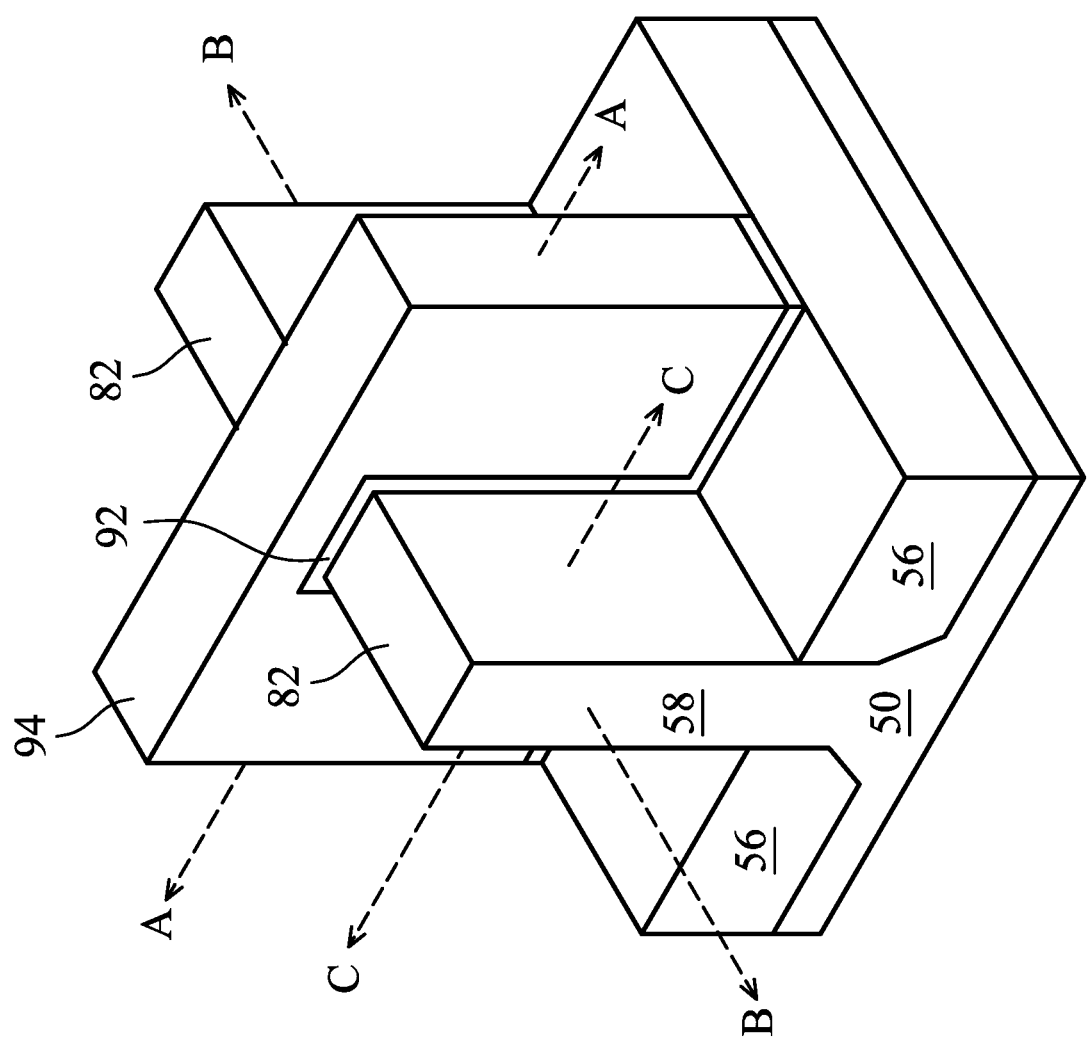
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosures are discussed in the context of forming semiconductor devices, and in particular, in the context of forming Fin Field-Effect Transistor (FinFET) devices. Principles of the disclosure may also be applied to other types of semiconductor device, such as planar devices. In addition, embodiments discussed herein are discussed in the context of FinFET devices formed using a gate-last process. In other embodiments, a gate-first process may be used.

In some embodiments, the channel region of a FinFET device (e.g., a p-type FinFET device) is doped with a stress-inducing material (e.g., a dopant such as germanium) for the channel to compensate for the threshold voltage variation caused by the diffusion of the dopant (e.g., boron) from the source/drain region into the channel region. In other words, the concentration of the stress-inducing material (e.g., germanium) in the channel region of a fin is formed in accordance with the concentration of the diffused dopant in the channel region of the fin to achieve a uniform threshold voltage. In various embodiments, the stress-inducing material refers to a dopant (e.g., germanium) in the channel region of the FinFET device, which dopant has a lattice constant different from that of a semiconductor material (e.g., silicon) of the channel region, thereby inducing a stress in the channel region. In some embodiments, higher concentrations of the stress-inducing material are used at locations with lower concentrations of the dopant, and lower concentrations of the stress-inducing material are used at locations with higher concentrations of the dopant, which results in a substantially uniform threshold voltage of the FinFET device. In some embodiments, the fin of the FinFET device is formed to have a gradient layer where the concentration of the stress-inducing material (e.g., germanium) increases along a first direction from the top surface of the fin distal a substrate of the FinFET device toward the substrate. The fin may additionally have a buffer layer under the gradient layer, where the buffer layer has a lower concentration of the stress-inducing material than the gradient layer. In addition, the fin may have a first layer with a first uniform concentration between the gradient layer and the buffer layer, and may further have a second layer with a second uniform concentration over the gradient layer, the first uniform concentration being larger than the second uniform concentration. In some embodiments, the fin of the FinFET device is formed to have a first layer with a first uniform concentration over a second layer with a second uniform concentration, the first uniform concentration being smaller than the second uniform concentration. The fin may additionally have a buffer layer under the second layer. In this manner, a concentration of the stress-inducing material (e.g., germanium in this example) may be adjusted to account for the specific dopant profile of a particular design.

FIG. 1 illustrates an example of a FinFET in a three-dimensional view, in accordance with some embodiments. The FinFET comprises a fin 58 on a substrate 50 (e.g., a semiconductor substrate). Isolation regions 56 are disposed on opposing sides of the fin 58, and the fin 58 protrudes above and from between neighboring isolation regions 56. A gate dielectric layer 92 is along sidewalls and over a top surface of the fin 58, and a gate electrode 94 is over the gate dielectric layer 92. Source/drain regions 82 are disposed in opposing sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

FIGS. 2-5, 11-14, 15A, 15B, 16A, 16B, 17A, 17B, 17C, 17D, 18A, 18B, 19A, 19B, 20A, 20B, 21A, 21B, 22A, 22B, 23A, and 23B are cross-sectional views of intermediate stages in the manufacturing of a FinFET device 100, in accordance with an embodiment. FIGS. 2-5 and 11-14 illustrate reference cross-section A-A illustrated in FIG. 1, except for multiple fins/gate structures. In FIGS. 15A through 23B, figures ending with an "A" designation are illustrated along reference cross-section A-A illustrated in FIG. 1, and figures ending with a "B" designation are illustrated along cross-section B-B illustrated in FIG. 1, except for multiple fins/gate structures. FIGS. 17C and 17D are illustrated along reference cross-section C-C illustrated in FIG. 1, except for multiple fins/gate structures.

Figure 2:
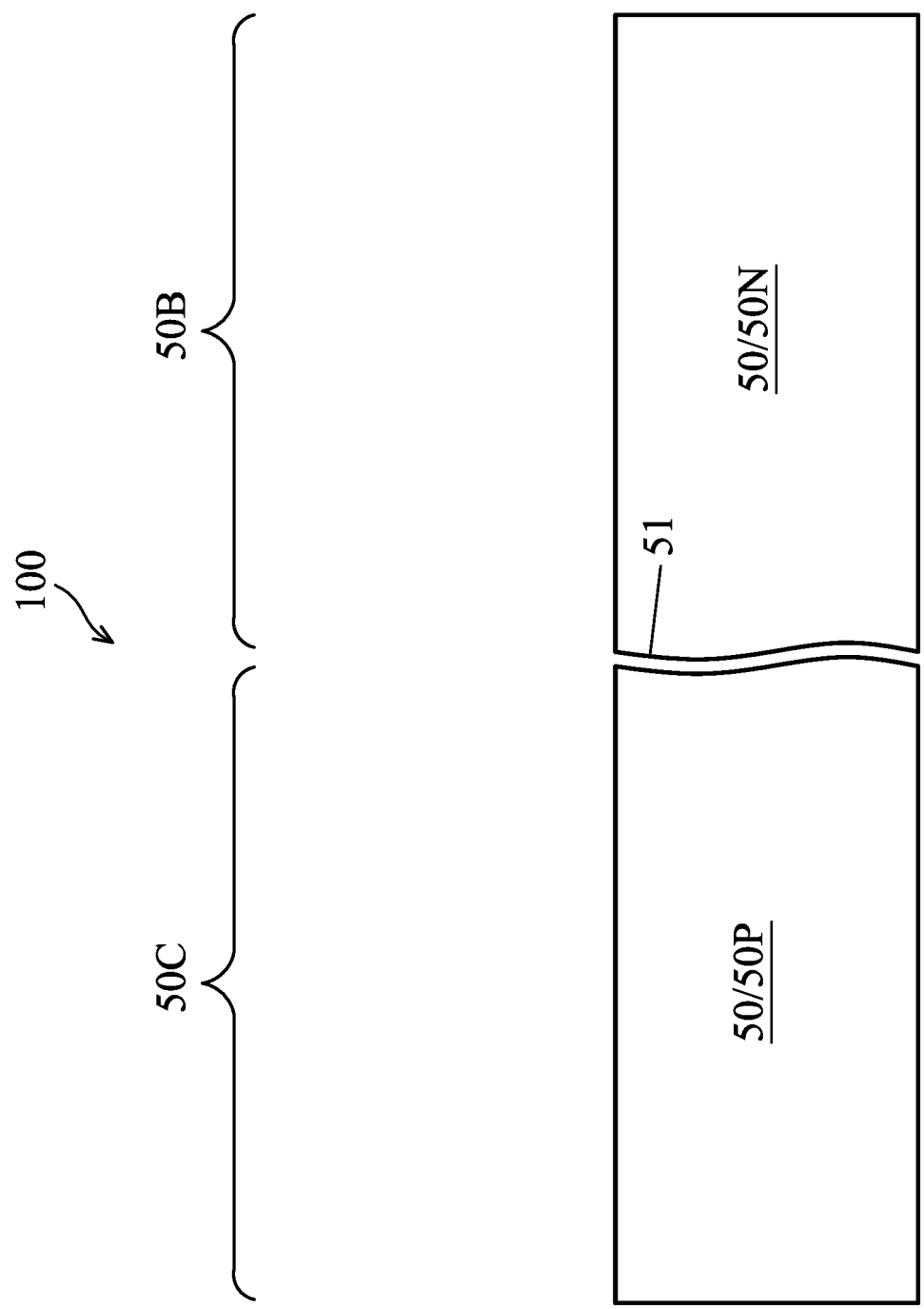
FIGS. 2-5 are cross-sectional views of intermediate stages in the manufacturing of a FinFET device 100, in accordance with an embodiment.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C.

In some embodiments, a P-well is formed in the region 50B (e.g., a region for n-type devices), and an N-well is formed in the region 50C (e.g., a region for p-type devices). The P-well and the N-well may each be formed by an implantation process followed by an anneal process. For example, to form the N-well in the region 50C, a mask layer may be formed to cover the region 50B and to expose the region 50C, and an n-type dopant (e.g., phosphorous, arsenic) is then implanted into the region 50C. The mask layer is then removed by a suitable method after the implantation process. An anneal process may be performed to activate the implanted dopant. Similarly, another mask layer may be formed to cover the region 50C and to expose the region 50B, a p-type dopant (e.g., boron, $BF_2$) is then implanted into the region 50B, and thereafter, the another mask layer is removed, followed by an anneal process. In some embodiments, both the region 50B and the region 50C are used to form the same type of devices, such as both regions being for n-type devices or p-type devices, in which case a P-well or an N-well are formed in both the region 50B and the region 50C.

Figure 3:
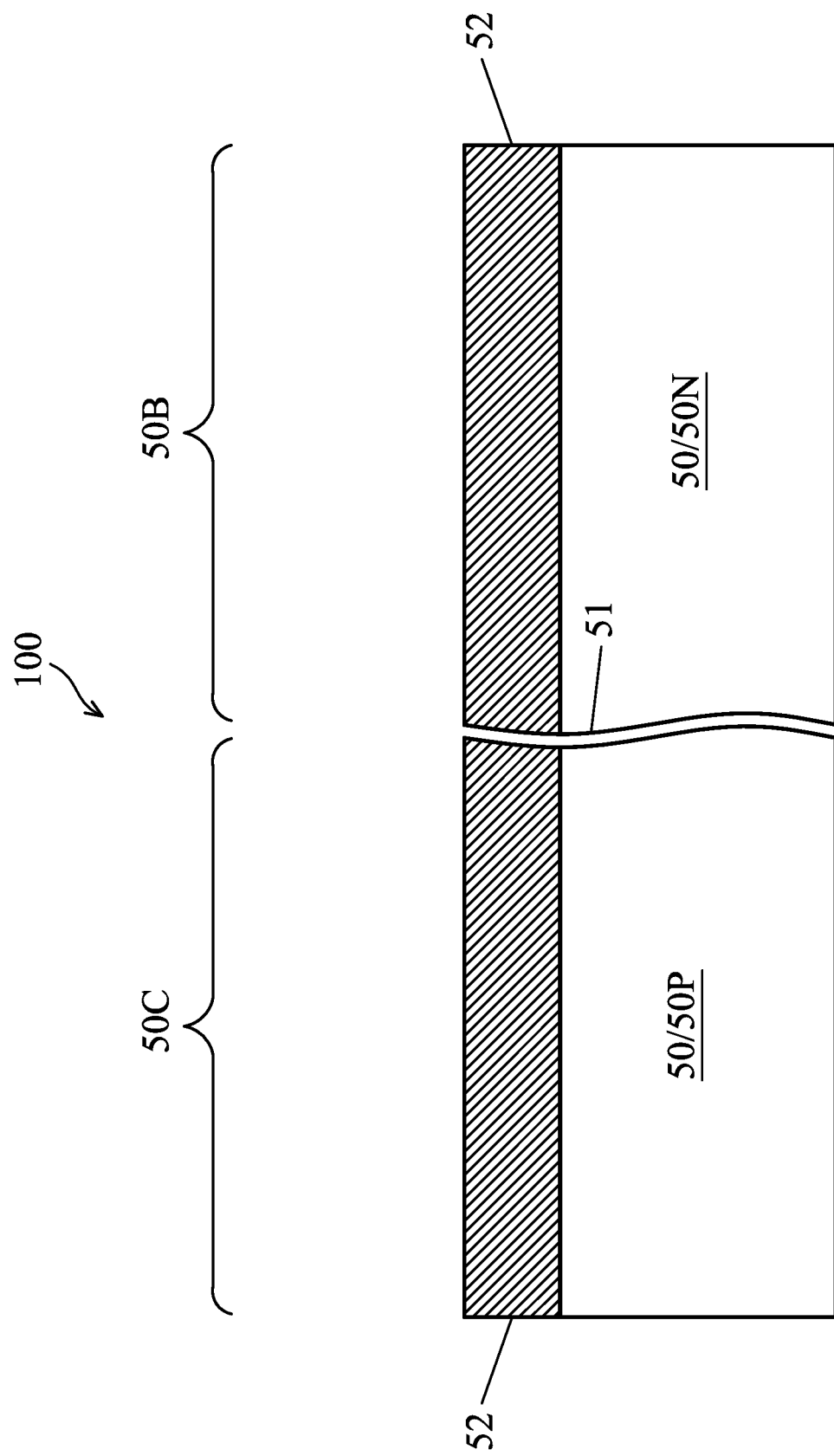

Next, in FIG. 3, an epitaxial material 52, such as an epitaxial silicon layer, is formed over the substrate 50 through an epitaxy process. In the example of FIG. 3, an epitaxial silicon layer is formed in both the region 50C and the region 50B.

Figure 4:
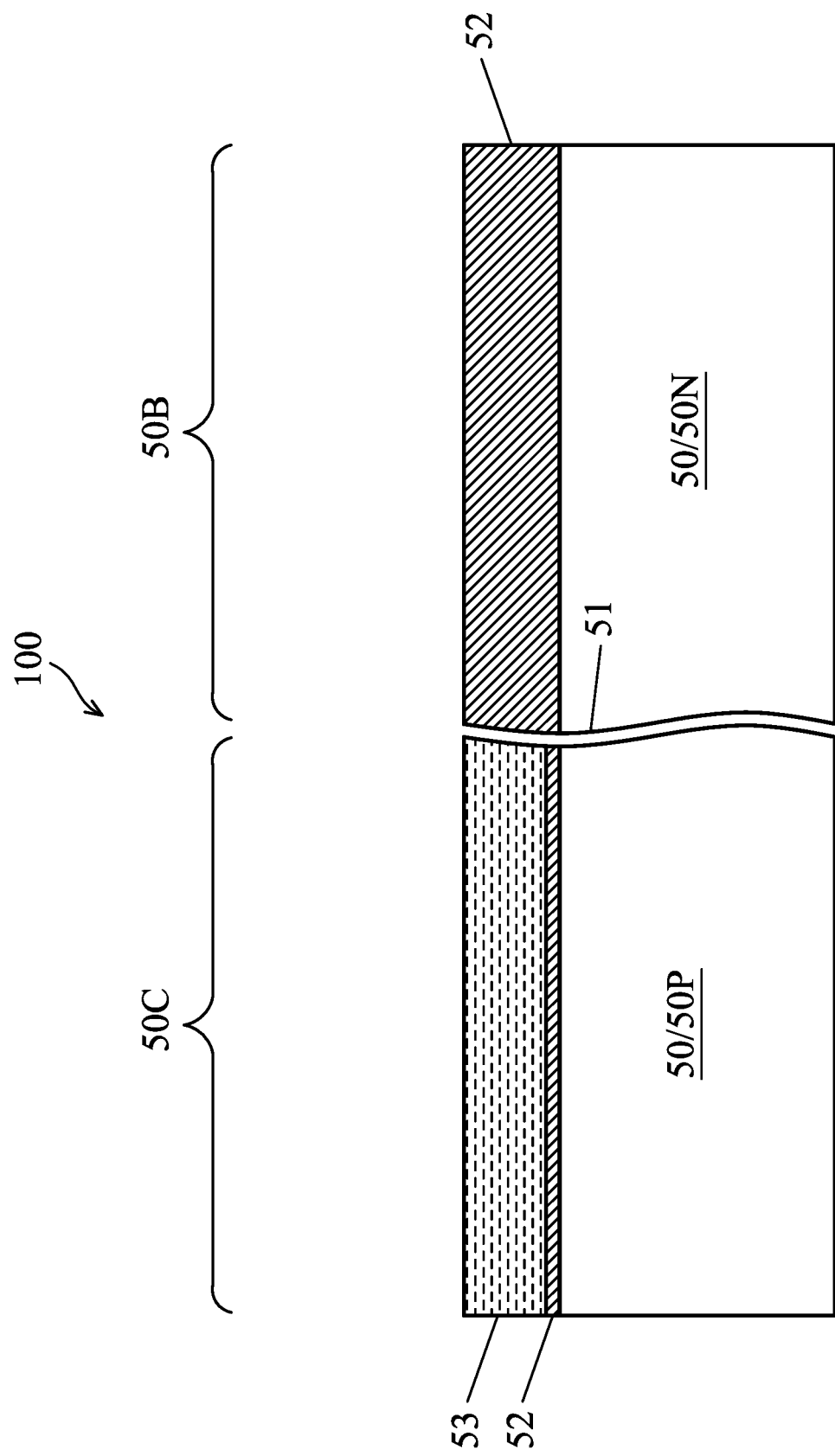

Next, in FIG. 4, upper portions of the epitaxial material 52 (e.g., an epitaxial silicon layer) in the region 50C (e.g., a p-type device region) are removed, and an epitaxial material 53, which may be suitable for forming p-type devices, is formed over the remaining portions of the epitaxial material 52 in the region 50C. In the illustrated embodiment, the epitaxial material 52 is an epitaxial silicon layer, and the epitaxial material 53 is an epitaxial silicon germanium layer. To form the epitaxial material 53, a mask layer may be formed to cover the epitaxial material 52 in the region 50B and to expose the epitaxial material 52 in the region 50C, then an etching process may be performed to remove the upper portions of the epitaxial material 52 in the region 50C. After the upper portions of the epitaxial material 52 are removed, an epitaxy process is performed to grow the epitaxial material 53 over the remaining portions of the epitaxial material 52 in the region 50C. After the epitaxial process, the mask layer is removed.

In an exemplary embodiment, the epitaxial material 53 is a compound semiconductor material, such as an epitaxial silicon germanium layer. Since the lattice constant of germanium is larger than that of silicon, germanium in the epitaxial silicon germanium layer induces a compressive stress to silicon in the epitaxial silicon germanium layer, which compressive stress may increase the carrier mobility in the channel region of the p-type device formed. Therefore, germanium may also be referred to as a stress-inducing material for silicon in the epitaxial silicon germanium layer. Depending on the context, germanium may also be referred to as a dopant in the epitaxial silicon germanium layer.

Discussion hereinafter may refer to the epitaxial material 53 as a silicon germanium layer 53, with the understanding that other suitable compound semiconductor material may also be used in place of silicon germanium for the epitaxial material 53. For example, in embodiments in which an n-type device is being formed, the stress-inducing material may comprise carbon, thereby forming a silicon carbon layer to induce a tensile stress.

In some embodiments, in the epitaxy process to form the silicon germanium layer 53, the process condition(s) is tuned such that the concentration of germanium in the silicon germanium layer 53 is non-uniform. In other words, the concentration of germanium at a first location within the silicon germanium layer 53 is different from the concentration of germanium at a second location within the silicon germanium layer 53. The non-uniform concentration of germanium is used to compensate for a non-uniform concentration of dopant (e.g., boron) diffused into the channel region from the source/drain region of the p-type device, thereby resulting in a substantially uniform threshold voltage for the p-type device formed, details of which are discussed hereinafter with reference to, e.g., FIGS. 6-10, 24A, 24B, 25A, 25B, and 25C.

Figure 5:
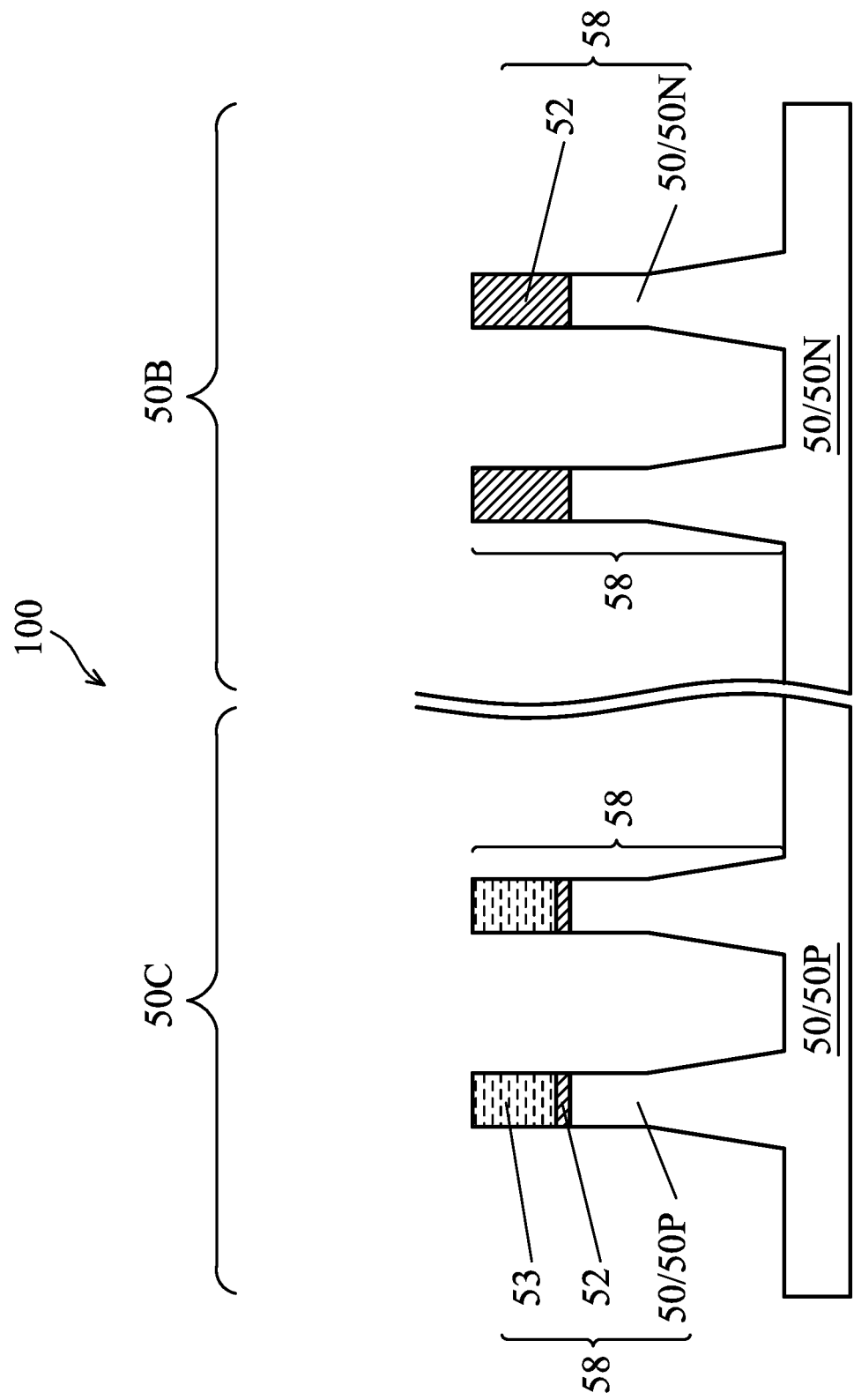

Next, in FIG. 5, fins 58 are formed. The fins 58 are semiconductor strips. In the example of FIG. 5, each of the fins 58 in the region 50C includes three layers, e.g., a bottom layer formed of the material of the substrate 50/50P, a middle layer formed of the material of the epitaxial material 52 (e.g., an epitaxial silicon layer), and an upper layer formed of the material of the silicon germanium layer 53. As illustrated in FIG. 5, each of the fins 58 in the region 50B includes two layers, e.g., a bottom layer formed of the material of the substrate 50/50N, and an upper layer formed of the material of the epitaxial material 52 (e.g., an epitaxial silicon layer). In some embodiments, the fins 58 are formed by etching trenches in the substrate 50 and the epitaxial materials (e.g., 52, 53).

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The etching may be any acceptable etch process, such as a reactive ion etch (RIE), neutral beam etch (NBE), the like, or a combination thereof. The etching may be anisotropic.

FIGS. 6-10 illustrate cross-sectional views of various embodiments of the silicon germanium layer 53 in the channel region of the fin 58 (e.g., in the region 50C) of the FinFET device 100 of FIG. 5, in accordance with various embodiments. To illustrate the relative locations, the epitaxial material 52 underlying the silicon germanium layer 53 is also illustrated in FIGS. 6-10. In addition, a capping layer 55 (e.g., a silicon capping layer) over the silicon germanium layer 53 is illustrated in phantom, which capping layer 55 may be formed in subsequent processing (see FIG. 13 and the discussion therein). In FIGS. 6-10, unless otherwise stated, similar numerals refer to the same or similar element that is formed by a same or similar method, thus details may not be repeated.

Figure 6:
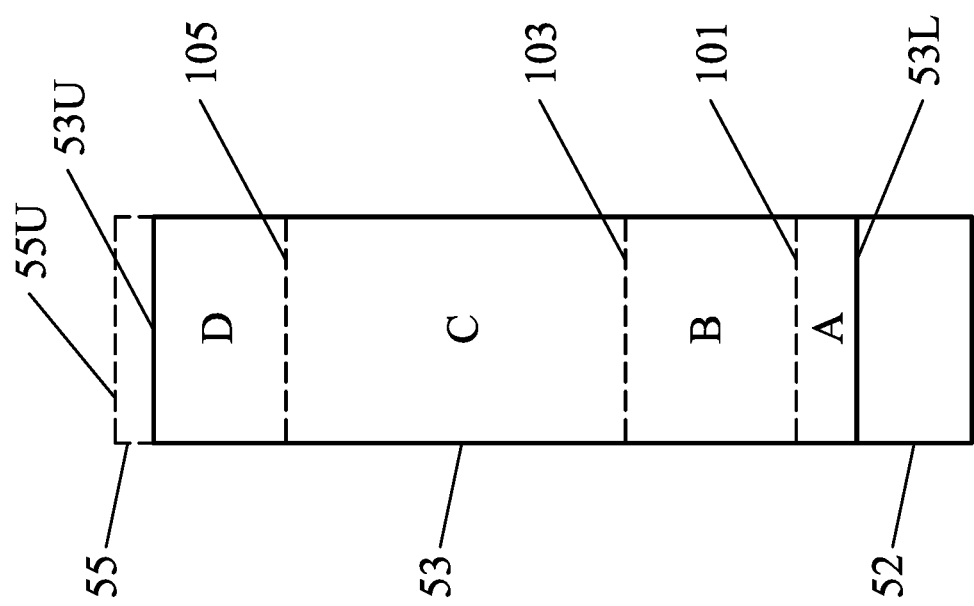
FIGS. 6-10 illustrate cross-sectional views of various embodiments of a fin of the FinFET device 100 of FIG. 5, in accordance with various embodiments.

Referring to FIG. 6, the silicon germanium layer 53 comprises four segments labeled as A, B, C, and D, where each of the segments may also be referred to as a sublayer of the silicon germanium layer 53. The interfaces between the segments A, B, C, and D are labeled as 101, 103, and 105, respectively, as illustrated in FIG. 6. The interfaces 101, 103, and 105 may not be seen in Transmission Electron Microscopy (TEM), but can be seen through Secondary Ion Mass Spectrometer (SIMS) analysis, in some embodiments. In the example of FIG. 6, the segment A is a buffer layer with a low concentration of germanium for reducing defects between the silicon germanium layer 53 and the underlying epitaxial material 52 (e.g., epitaxial silicon layer). The segment A may comprise SiGe, SiGe:C, or combinations thereof, as examples. In the illustrated embodiment, the concentration of germanium in the segment A is uniform, and is between about 0 atomic percentage (at %) to about 1.5 at %. A thickness of the segment A, measured along a vertical direction in FIG. 6 (e.g., from the epitaxial material 52 toward an upper surface 53U of the silicon germanium layer 53), is between about 0.5 nm and about 5 nm, in some embodiments.

The concentration of germanium in the segment B of FIG. 6 is uniform (e.g., uniform within limitations of manufacturing) and has a value between about 25 at % and about 28 at %. A thickness of the segment B, measured along the vertical direction of FIG. 6, is between about 10 nm and about 20 nm, in some embodiments. The concentration of germanium in the segment B is higher than that in the segment A. A width of the fin 58, which is measured between opposing sidewalls of the fin in FIG. 6 (e.g., between opposing sidewalls of the silicon germanium layer 53), is between 3 nm and about 6 nm, in the illustrated embodiment.

Still referring to FIG. 6, the concentration of germanium in the segment C increases continuously along the vertical direction from the interface 105 toward the interface 103. In other words, the segment C has a gradient concentration of germanium, and therefore, the segment C is also referred to as a gradient sublayer of the silicon germanium layer 53. In some embodiments, the concentration of germanium in the segment C proximate the interface 105 is between about 15 at % and about 20 at %, and the concentration of germanium in the segment C proximate the interface 103 is between about 25 at % and about 28%. A thickness of the segment C, measured along the vertical direction of FIG. 6, is between about 15 nm and about 30 nm. In the illustrated embodiment, the concentration of germanium in the segment B is equal to the highest concentration of germanium in the segment C (e.g., at the interface 103).

FIG. 6 further illustrates the segment D over the segment C. In the illustrated embodiment, the segment D has a uniform (e.g., uniform within limitations of manufacturing) concentration of germanium that is between about 15 at % and about 20 at %. In other words, the concentration of germanium in the segment D is equal to the lowest concentration of germanium of the segment C (e.g., at the interface 105). A thickness of the segment D, measured along the vertical direction of FIG. 6, is between about 5 nm and about 10 nm. In the example of FIG. 6, the uniform concentration of germanium in the segment D is smaller than the uniform concentration of germanium in the segment B. In some embodiments, the thickness of the segment C is larger than the thickness of the segment D, and is also larger than the thickness of the segment B.

Figure 13:
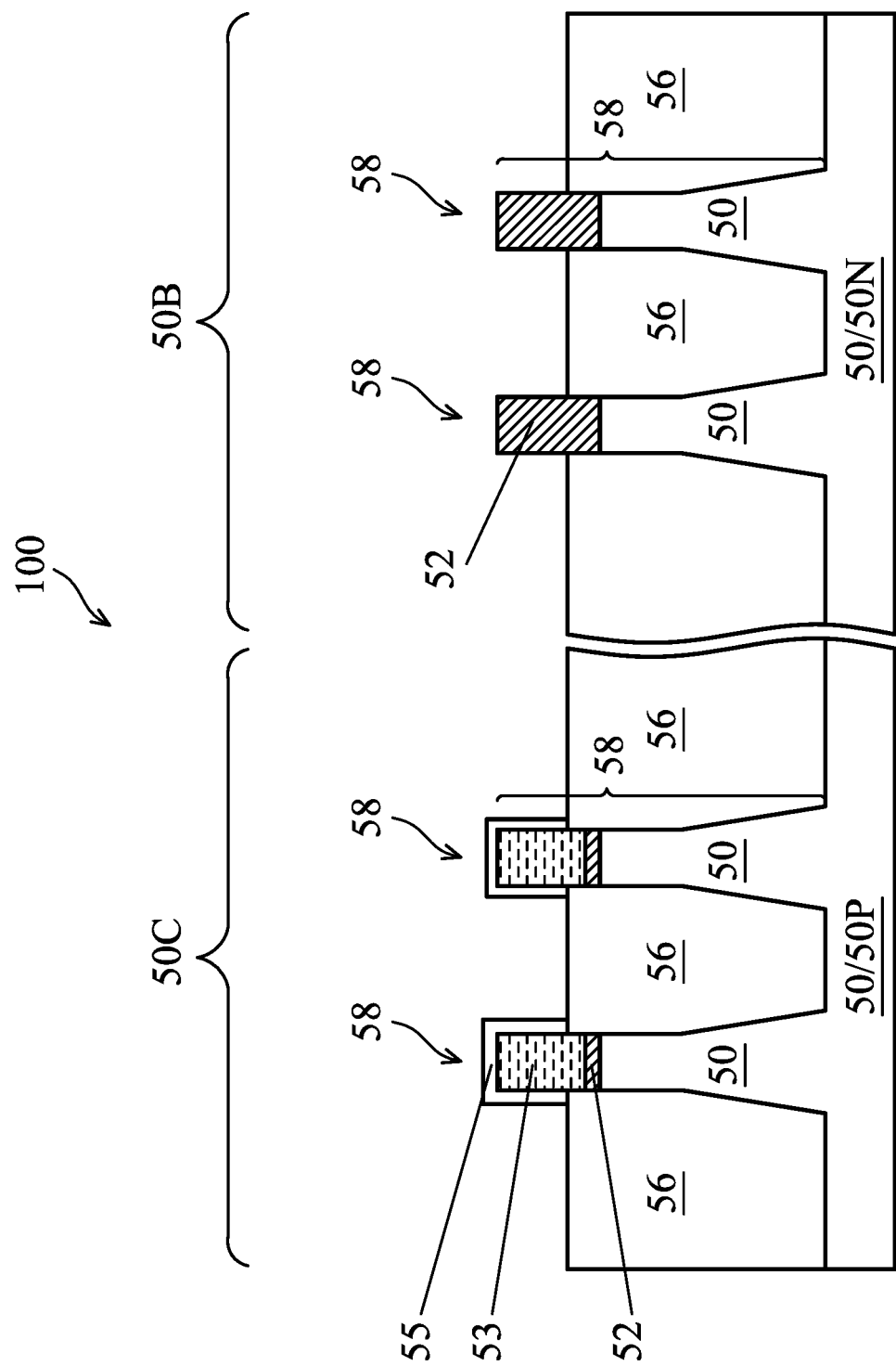

In addition, FIG. 6 illustrates in phantom a capping layer 55 over the silicon germanium layer 53. The capping layer 55 may be a silicon capping layer that is substantially free of germanium. The capping layer 55 may be formed in subsequent processing (see FIG. 13), before a dummy dielectric layer 60 (see FIG. 14) is formed over the fin 58. Although the capping layer 55 in FIG. 6 is illustrated to be on top of the segment D, the capping layer 55 may also extend along sidewalls of the silicon germanium layer 53, as illustrated in FIG. 13.

In some embodiments, the concentration of germanium in the silicon germanium layer 53 is formed to be non-uniform to compensate for the effect of dopant diffusion from doped source/drain regions into the channel region of the FinFET device 100. For example, in subsequent processing, the source/drain regions 82 (see FIG. 17B) doped with a dopant (e.g., boron) are formed, and the dopant of the source/drain regions may diffuse into the channel region of the FinFET device 100. Since the concentration of the diffused dopant (e.g., boron) in the channel region may be non-uniform, diffusion of the dopant into the channel region, if left uncompensated for, may cause a non-uniform threshold voltage for the FinFET device 100. In other words, different areas of the channel region (e.g., different areas disposed along the vertical direction from the top of the fin 58 toward the substrate 50) of the FinFET device 100 may have different threshold voltages, thus may be turned on (e.g., forming an electrically conducting path) at different voltages. A non-uniform threshold voltage may make it difficult to control the ON and OFF state of the FinFET device 100 effectively, and may degrade the performance of the FinFET device.

Embodiments of the present disclosure compensate for the dopant diffusion from the source/drain regions into the channel region by varying the concentration of germanium (e.g., a stress-inducing material) in the channel region in accordance with the concentration of the diffused dopant. For example, in the p-type device region, the dopant (e.g., boron) diffused into the channel region may reduce the threshold voltage by providing more carriers in the channel region. Therefore, for areas of the channel region with high concentrations of dopant (e.g., boron), a lower concentration of germanium is formed; and for areas of the channel region with low concentrations of dopant (e.g., boron), a higher concentration of germanium is formed. Since the dopant (e.g., boron) provides carrier (e.g., p-type carrier) which may lower the threshold voltage, and since germanium induces stress in the channel region of the p-type device, which stress may increase carrier mobility and lower threshold voltage, a lower concentration of germanium (thus lower carrier mobility) may balance out a higher concentration of boron (thus higher carrier concentration). Similarly, a higher concentration of germanium (thus higher carrier mobility) may balance out a lower concentration of boron (thus lower carrier concentration). By tuning the germanium concentration in the channel region to counteract the dopant (e.g., boron) concentration in the channel region, a substantially uniform threshold voltage is achieved for the FinFET device 100.

The concentration of the dopant (e.g., boron) diffused from the source/drain region into the channel region may be obtained through computer simulations, analysis of FinFET devices formed, or a combination thereof. Once the concentration of the diffused dopant in the channel region is determined, the germanium concentration in the silicon germanium layer 53 of the fin 58 may be determined accordingly. For example, a lower concentration of germanium may be formed in an area with higher dopant (e.g., boron) concentration, and a higher concentration of germanium may be formed in an area with a lower dopant (e.g., boron) concentration. More details are discussed hereinafter with reference to FIGS. 24A, 24B, and 25A-25C.

In some embodiments, the silicon germanium layer 53 is formed by an epitaxy process using precursors comprising silicon and germanium. For example, a first precursor comprising germane ($GeH_4$), digermane ($Ge_2H_6$), or combinations thereof, may be used as the precursor comprising germanium, and a second precursor comprising silane ($SiH_4$), dichlorosilane ($SiH_2Cl_2$), or combinations thereof, may be used as the precursor comprising silicon. In some embodiments, the epitaxy process is performed using $GeH_4$, $SiH_4$, and HCl as precursors. In some embodiments, the epitaxy process is performed using $GeH_4$, $Ge_2H_6$, $SiH_4$, $SiH_2Cl_2$, and HCl as precursors. In yet another embodiment, the epitaxy process is performed using $GeH_4$, HCl, $SiH_4$, and $SiH_2Cl_2$ as precursors. The epitaxy process may be performed in a deposition chamber. Carrier gases, such as Ar, He, $N_2$, $H_2$, combinations thereof, or the like, may be used to carrier the precursors into the deposition chamber. As the epitaxy process proceeds, the silicon germanium layer 53 grows on the epitaxial material 52 along the upward direction of FIG. 6.

As an example, consider the embodiment where the epitaxy process is performed using $GeH_4$, $Ge_2H_6$, $SiH_4$, $SiH_2Cl_2$, and HCl as precursors. The epitaxy process may be performed with a flow rate of $SiH_4$ in a range between about 10 standard cubic centimeters per minute (sccm) and about 200 sccm, a flow rate of $GeH_4$ between about 100 sccm and about 1000 sccm, a flow rate of HCl between about 10 sccm and about 500 sccm, a flow rate of $SiH_2Cl_2$ between about 10 sccm and about 500 sccm, and a flow rate of $Ge_2H_6$ between about 100 and about 1000 sccm. A temperature of the epitaxy process may be between about 500° C. and about 700° C., and a pressure of the epitaxy process may be between about 5 torr to about 300 torr.

In various embodiments, the flow rates and/or the ratios between the flow rates of different precursors may be changed to change the germanium concentration in the silicon germanium layer 53. For example, increasing the flow rate of the germanium-containing precursor(s) (e.g., $GeH_4$, and $Ge_2H_6$), or increasing the ratio of the flow rate of the germanium-containing precursor(s) to other precursors, may increase the concentration of germanium in the silicon germanium layer 53. Conversely, decreasing the flow rate of the germanium-containing precursor(s), or decreasing the ratio of the flow rate of the germanium-containing precursor(s) to other precursors, may decrease the concentration of germanium in the silicon germanium layer 53.

In some embodiments, during formation of the segment C (the gradient sublayer) of the silicon germanium layer 53, the flow rate of the germanium-containing precursor(s), or the ratio of the flow rate of the germanium-containing precursor(s) to other precursors, is gradually reduced as the segment C is formed, such that the concentration of germanium is gradually decreased along a direction from the bottom of the segment C toward the top of the segment C in FIG. 6. In other embodiments, during formation of the segment C (the gradient sublayer), the flow rates of all the precursors are kept constant at respective pre-determined values, and the temperature of the epitaxy process is gradually increased to reduce the concentration of germanium along the direction from the bottom of the segment C toward the top of the segment C in FIG. 6. The temperature difference between the temperature used at the bottom of the segment C and the temperature used at the top of the segment C may depend on the thickness of the segment C, and may be between about 50° C. and about 100° C. As the temperature of the epitaxy process increases, the growth rate (e.g., deposition rate) of the epitaxial material 53 increases, and the adsorption rate of germanium decreases, thereby resulting in the decrease in the germanium concentration, in some embodiments. During formation of the segments with uniform germanium concentrations (e.g., segment B, segment D), the flow rates of the precursors and the process temperature are kept constant at pre-determined values, in some embodiments.

Figure 7:
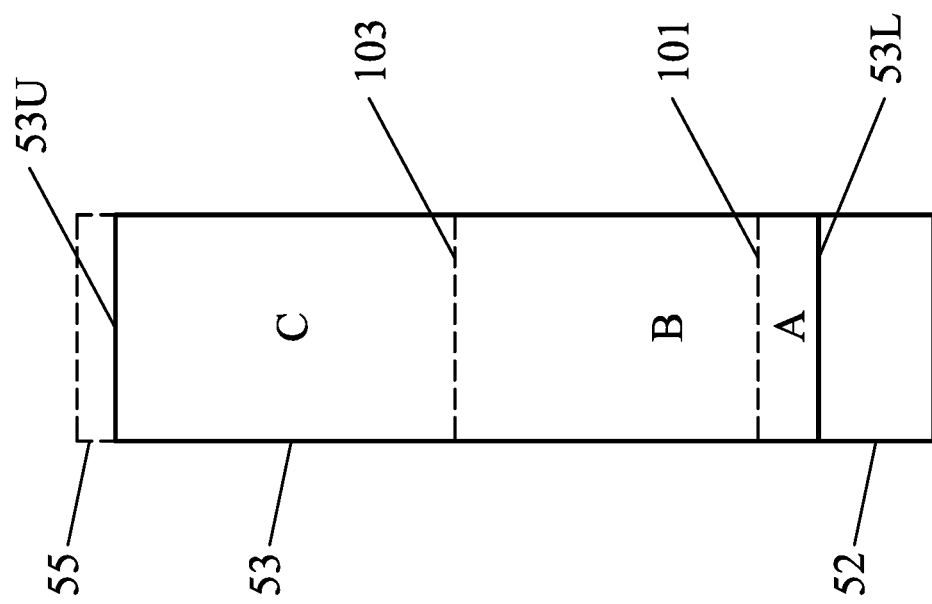

FIG. 7 illustrates a cross-sectional view of another embodiment of the silicon germanium layer 53 in the fin 58 of the FinFET device 100 of FIG. 5. The silicon germanium layer 53 in FIG. 7 is similar to that in FIG. 6, except without the segment D in FIG. 6. In particular, the silicon germanium layer 53 in FIG. 7 has a segment A, which serves as a buffer layer and may have a thickness between about 0 nm and 5 nm and a germanium concentration between about 0 at % and about 5 at %. The segment B has a uniform (e.g., uniform within manufacturing limitations) germanium concentration that is between about 25 at % and about 28 at %. The segment C is a gradient sublayer with the germanium concentration decreasing continuously as the segment C extends away from the epitaxial material 52. The germanium concentration at the bottom of the segment C (e.g., proximate the interface 103) is between about 25 at % and about 28 at %, and the germanium concentration at the top of the segment C (e.g., proximate the upper surface 53U) is between about 10 at % and about 20 at %. In the example of FIG. 7, the segment B and the segment C have a same thickness, which is between about 25 nm and about 30 nm.

Figure 8:
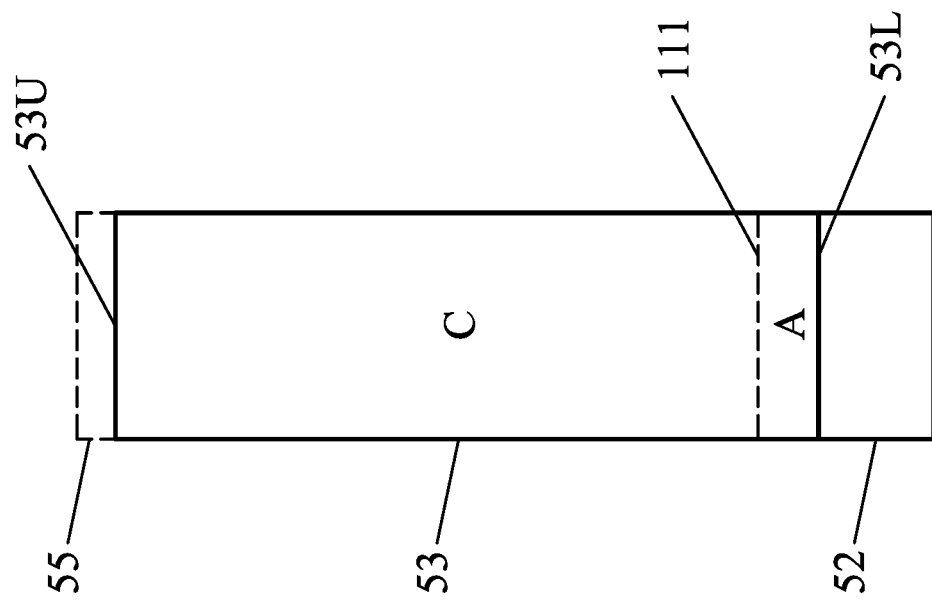

FIG. 8 illustrates a cross-sectional view of another embodiment of the silicon germanium layer 53 in the fin 58 of the FinFET device 100 of FIG. 5. The silicon germanium layer 53 in FIG. 8 is similar to that in FIG. 6, except without the segment B and without the segment D of FIG. 6. In particular, the silicon germanium layer 53 in FIG. 8 has a segment A, which serves as a buffer layer and may have a thickness between about 0 nm and 5 nm and a germanium concentration between about 0 at % and about 5 at %. The segment C is a gradient sublayer with the germanium concentration decreasing continuously as the segment C extends away from the epitaxial material 52. The germanium concentration at the bottom of the segment C (e.g., proximate the interface 111 between the segments A and C) is between about 25 at % and about 28 at %, and the germanium concentration at the top of the segment C (e.g., proximate the upper surface 53U) is between about 10 at % and about 20 at %. A thickness of the segment C is between about 50 nm and about 60 nm.

Figure 9:
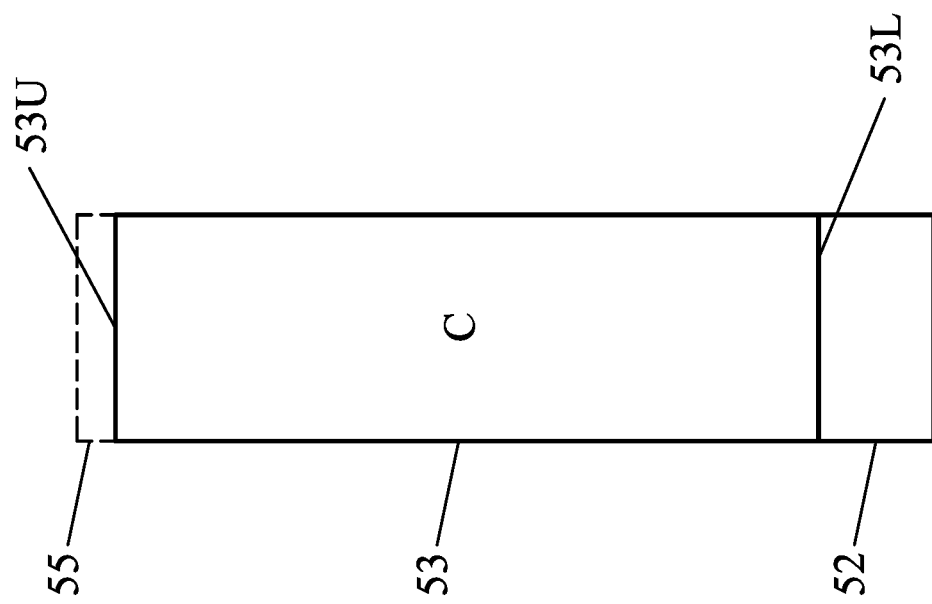

FIG. 9 illustrates a cross-sectional view of another embodiment of the silicon germanium layer 53 in the fin 58 of the FinFET device 100 of FIG. 5. The silicon germanium layer 53 in FIG. 9 is similar to that in FIG. 6, except without the segments A, B and D of FIG. 6. In other words, the silicon germanium layer 53 in FIG. 9 only has the segment C, which is a gradient sublayer with the germanium concentration decreasing continuously as the segment C extends away from the epitaxial material 52. The germanium concentration at the bottom of the segment C (e.g., proximate the lower surface 53L) is between about 25 at % and about 28 at %, and the germanium concentration at the top of the segment C (e.g., proximate the upper surface 53U) is between about 10 at % and about 20 at %. A thickness of the segment C is between about 50 nm and about 60 nm.

Figure 10:
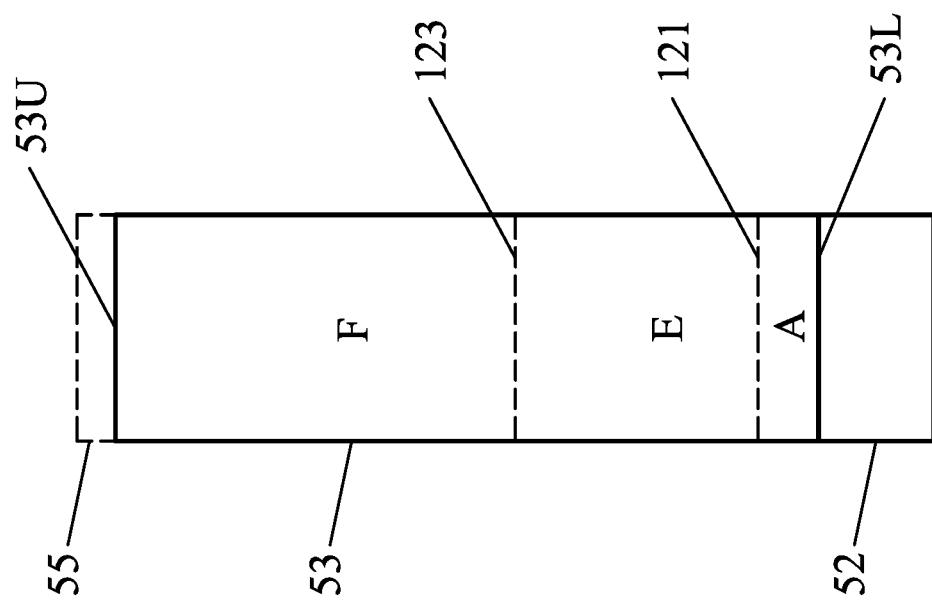

FIG. 10 illustrates a cross-sectional view of another embodiment of the silicon germanium layer 53 in the fin 58 of the FinFET device 100 of FIG. 5. In FIG. 10, the silicon germanium layer 53 has the segment A, which is the buffer layer with a thickness between about 0 nm and 5 nm and a germanium concentration between about 0 at % and about 5 at %. In addition, the silicon germanium layer 53 has a segment E with a uniform (e.g., uniform with manufacturing limitations) germanium concentration that is between about 20 at % and about 30 at %, and a segment F with a uniform (e.g., uniform with manufacturing limitations) germanium concentration that is between about 15 at % and about 25 at %. FIG. 10 further illustrates an interface 121 between the segment A and the segment E, and an interface 123 between the segment E and the segment F. In the illustrated example of FIG. 10, the segment E and the segment F have a same thickness, which is between about 25 nm and about 30 nm.

The example illustrated in FIGS. 6-10 are non-limiting examples. The silicon germanium layer 53 may have other numbers of segments or sublayers with other germanium concentrations, which may be determined based on the concentration of the diffused dopant from the source/drain regions to the channel region. These and other variations are fully intended to be included within the scope of the present disclosure.

Figure 11:
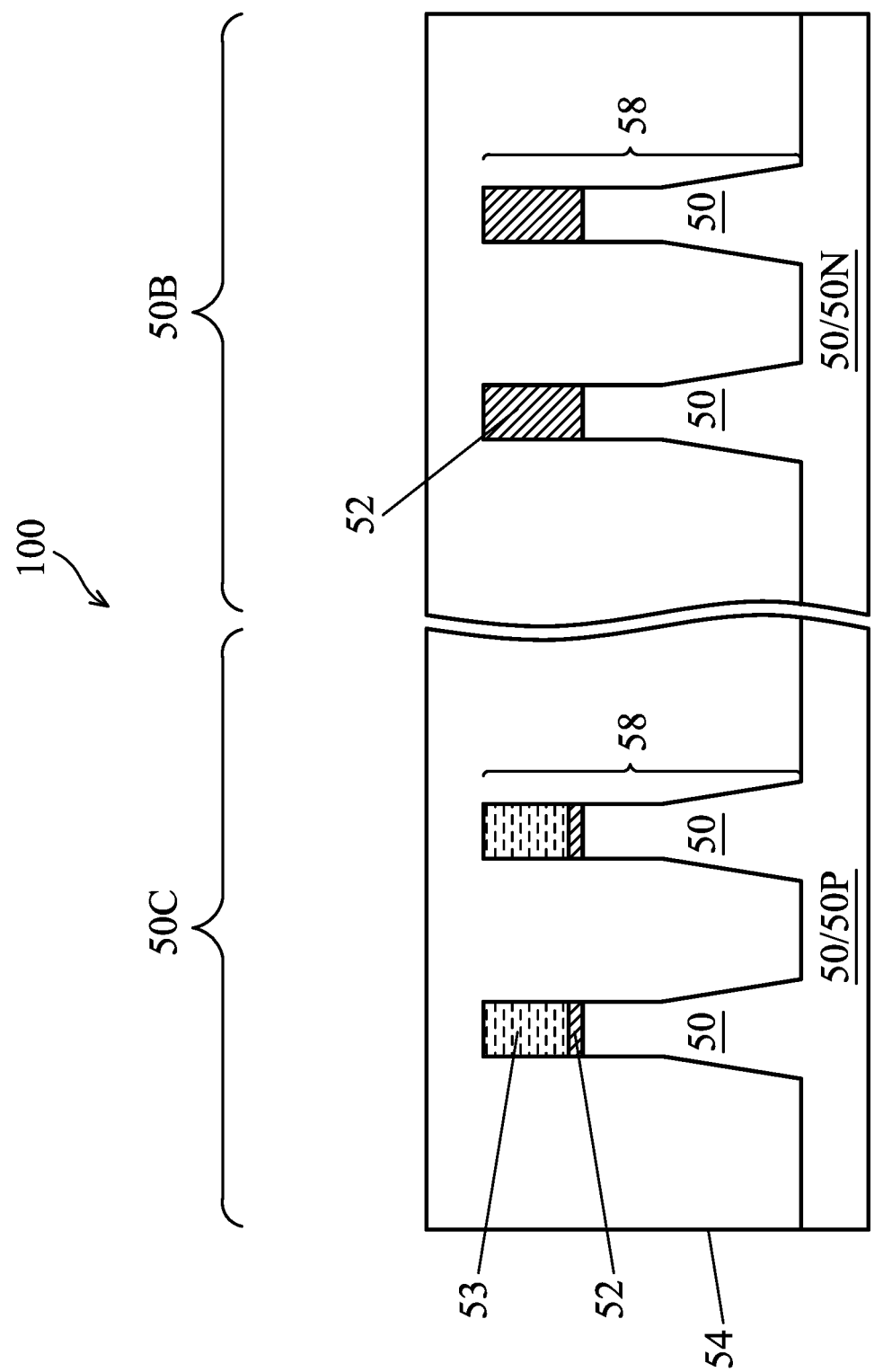

Processing continues after the fins 58 are formed in FIG. 5. Referring now to FIG. 11, an insulation material 54 is formed over the substrate 50 and between neighboring fins 58. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 58.

Figure 12:
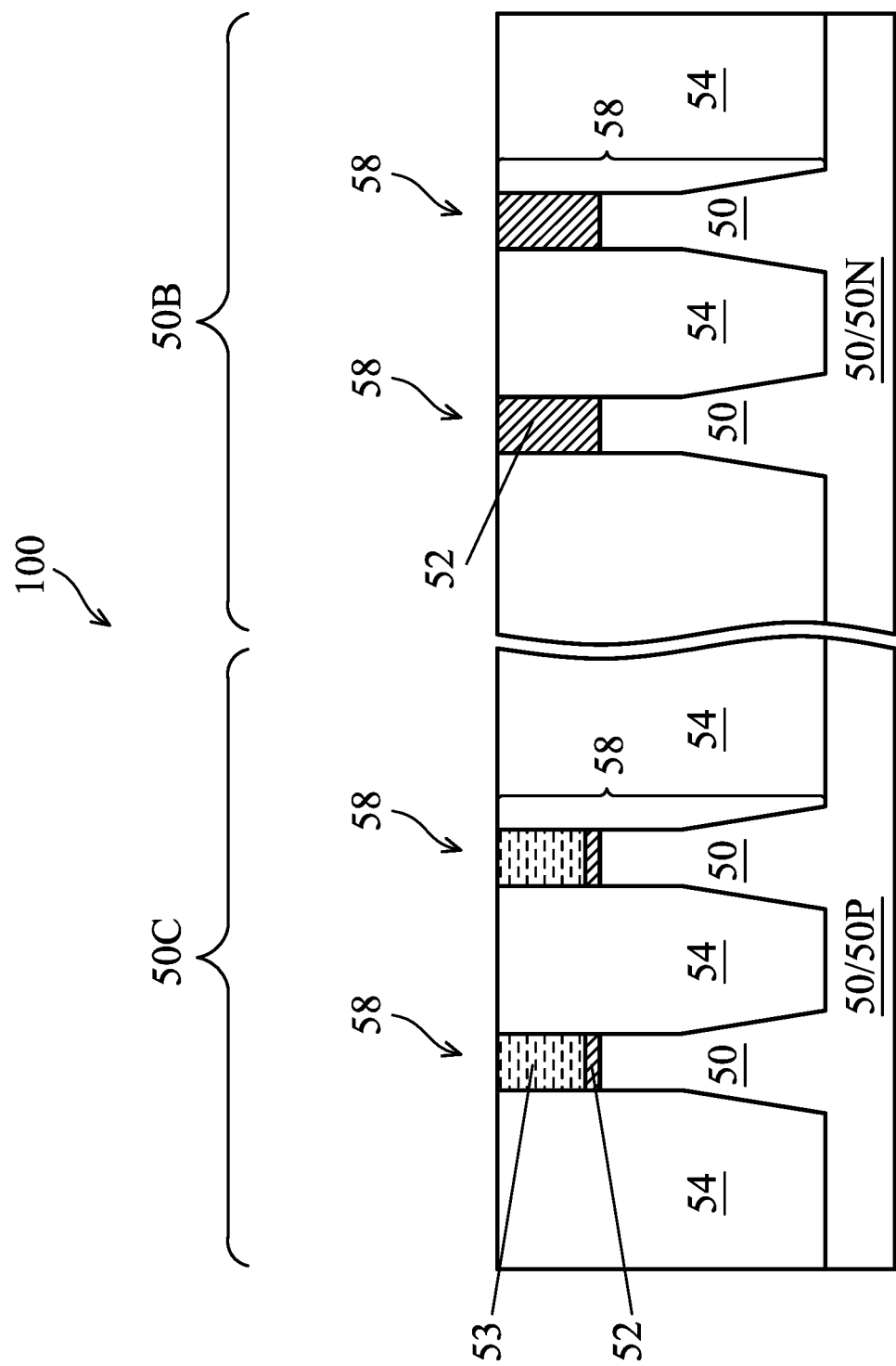

Next, in FIG. 12, a planarization process is applied to the insulation material 54. In some embodiments, the planarization process includes a chemical mechanical polish (CMP), an etch back process, combinations thereof, or the like. The planarization process exposes the fins 58. Top surfaces of the fins 58 and the insulation material 54 are level after the planarization process is complete.

Next, in FIG. 13, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using Certas (HF and $NH_3$), Siconi ($NF_3$ and $NH_3$), or dilute hydrofluoric (dHF) acid may be used.

In some embodiments, a capping layer 55, such as a silicon capping layer, is formed over the exposed surfaces of the fins 58 in the region 50C, using a suitable formation method such as PVD, CVD, or the like. In the illustrated embodiment, the capping layer 55 is not formed over the exposed surfaces of the fin 58 in the region 50B. The capping layer 55 may protect the fin 58 in the region 50C from subsequent processing steps (e.g., etching) to form dummy gate structures 75. In some embodiments, the capping layer 55 is omitted. For simplicity, the capping layer 55 is not illustrated in subsequent figures, with the understanding that the capping layer 55 may be formed over the fin 58 in the region 50C.

A person having ordinary skill in the art will readily understand that the process described with respect to FIGS. 2 through 13 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In another embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 14:
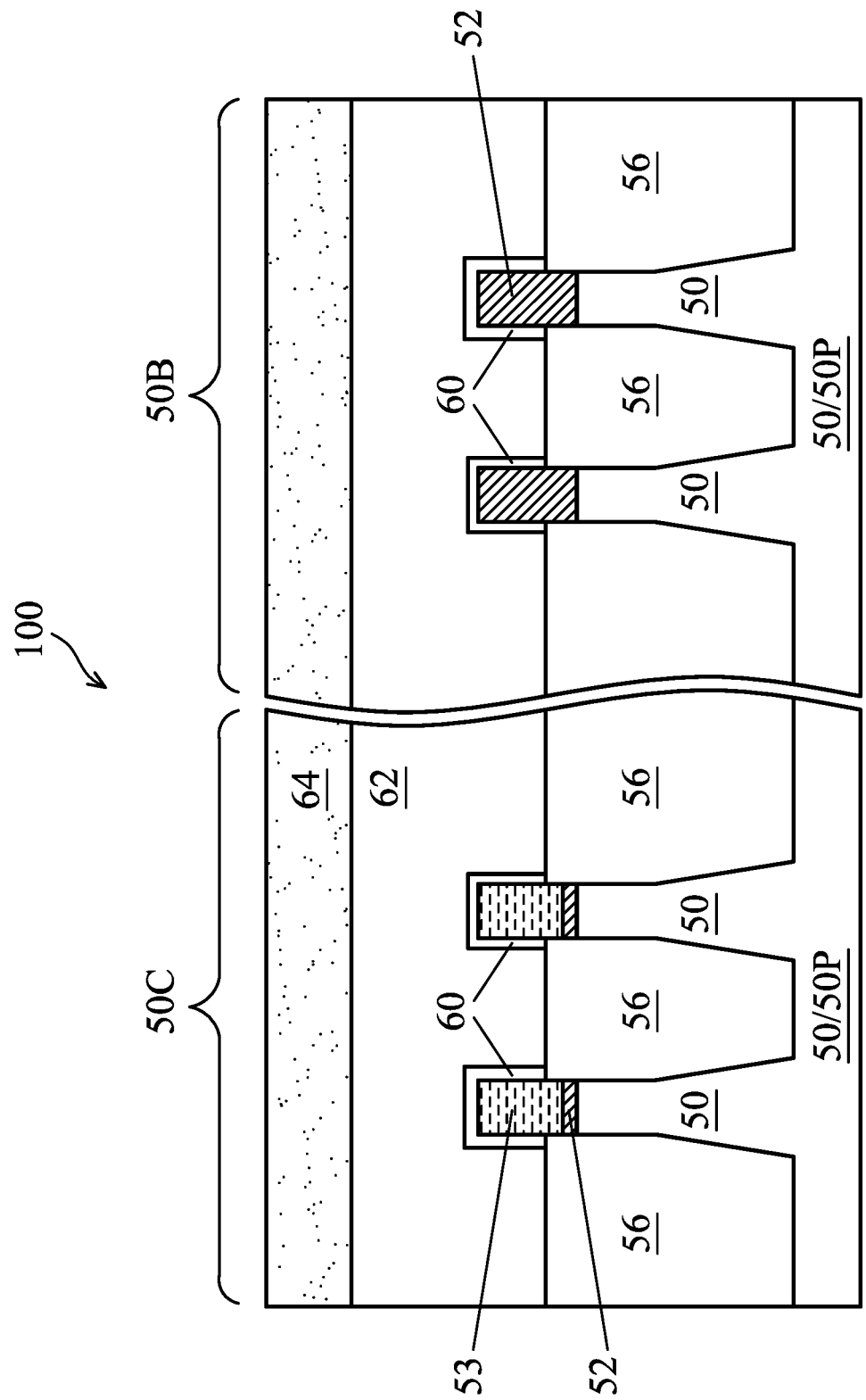

In FIG. 14, a dummy dielectric layer 60 is formed on the fins 58. In embodiments where the capping layer 55 (see FIG. 13) is formed, the dummy dielectric layer 60 is formed on the capping layer 55. The dummy dielectric layer 60 may be, for example, silicon oxide, silicon nitride, a combination thereof, or the like, and may be deposited or thermally grown according to acceptable techniques. The dummy dielectric layer 60 is illustrated in FIG. 14 as being formed over the upper surface and the sidewalls of the fins 58. This is merely a non-limiting example. The dummy dielectric layer 60 may also be formed over the STI regions 56. For example, the dummy dielectric layer 60 may extend continuously from a fin 58 to a neighboring fin 58, and may cover the upper surface of the STI regions 56.

As illustrated in FIG. 14, a dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of underlying layers, such as the dummy dielectric layer 60 and/or the STI regions 56 in this example. The mask layer 64 may include, for example, silicon nitride (e.g., SiN), silicon oxide nitride (e.g., SiON), or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 15A through 23B illustrate various additional steps in the manufacturing of the FinFET device 100. Although FIGS. 15A through 23B illustrate features in the region 50C, processing in the region 50B may be similar to that in the region 50C. Differences in the structures of the region 50B and the region 50C are described in the text accompanying each figure.

In FIGS. 15A and 15B, the mask layer 64 may be patterned using suitable photolithography and etching techniques to form masks 74. The pattern of the masks 74 then may be transferred to the dummy gate layer 62 by suitable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective fins 58. Respective mask 74, dummy gate 72, and the dummy dielectric layer 60 underlying the dummy gate 72 may be collectively referred to as a dummy gate structure 75.

Further in FIGS. 15A and 15B, gate seal spacers 80 are formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In some embodiments, a mask, such as a photoresist, may be formed over the region 50B while exposing the region 50C, and appropriate type (e.g., p-type) impurities may be implanted into the exposed fins 58 in the region 50C. The mask may then be removed. Subsequently, a mask, such as a photoresist, may be formed over the region 50C while exposing the region 50B, and appropriate type impurities (e.g., n-type) may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 16B:
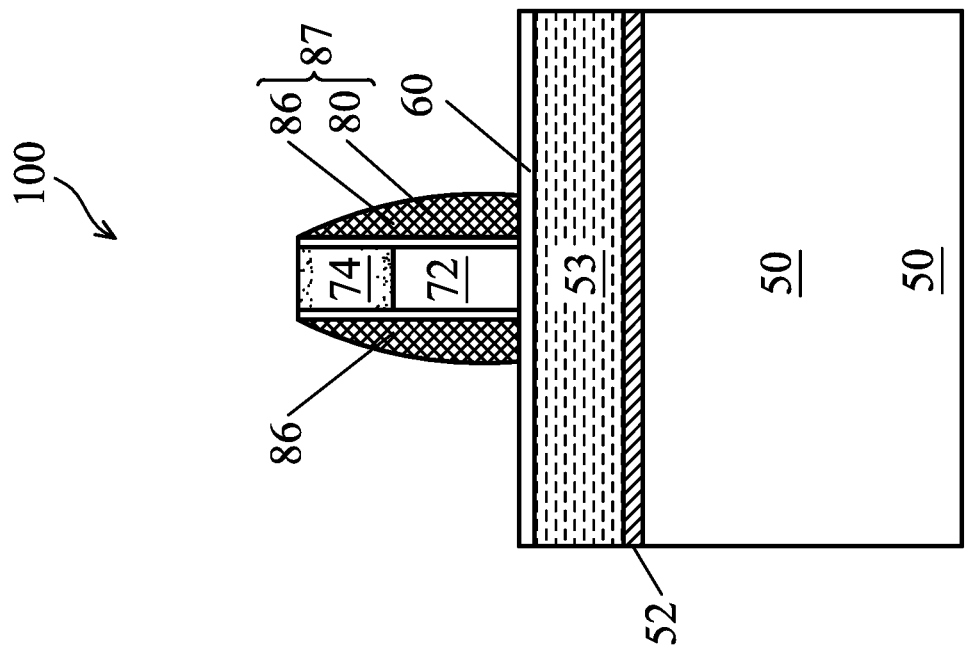
Figure 16A:
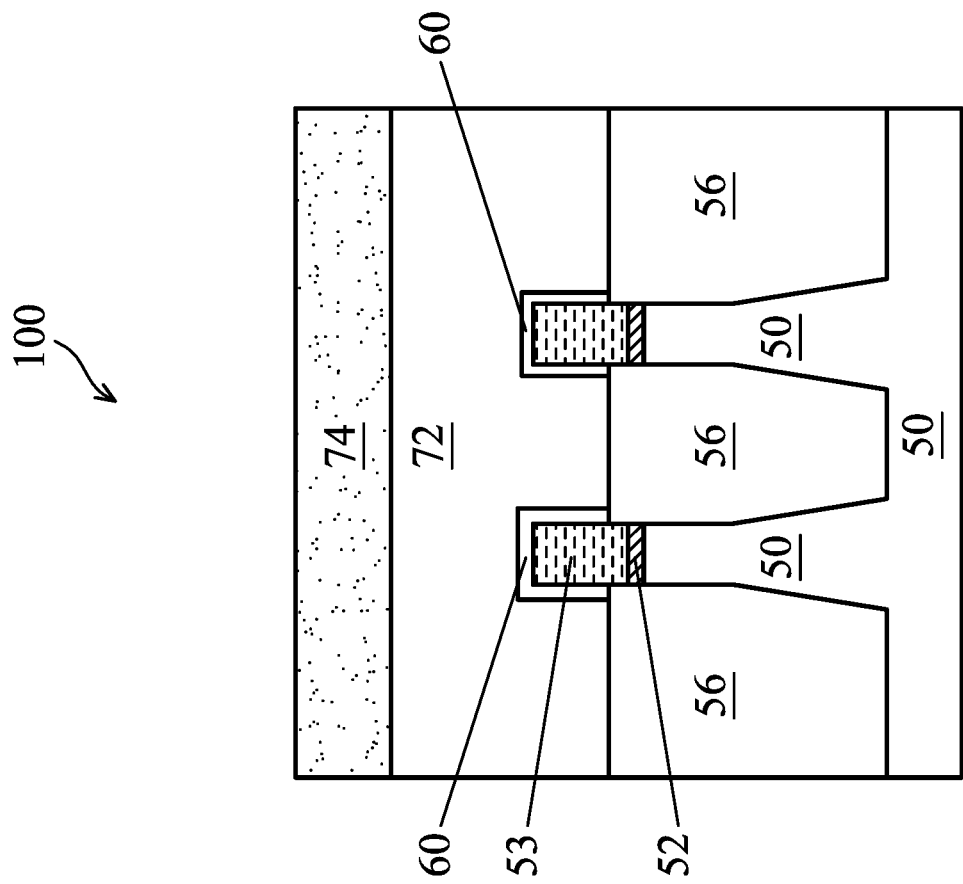

Next, in FIGS. 16A and 16B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, silicon carbon nitride (e.g., SiCN), a combination thereof, or the like. The gate seal spacer 80 and the gate spacer 86 may be collectively referred to as a gate spacer 87.

Figure 17B:
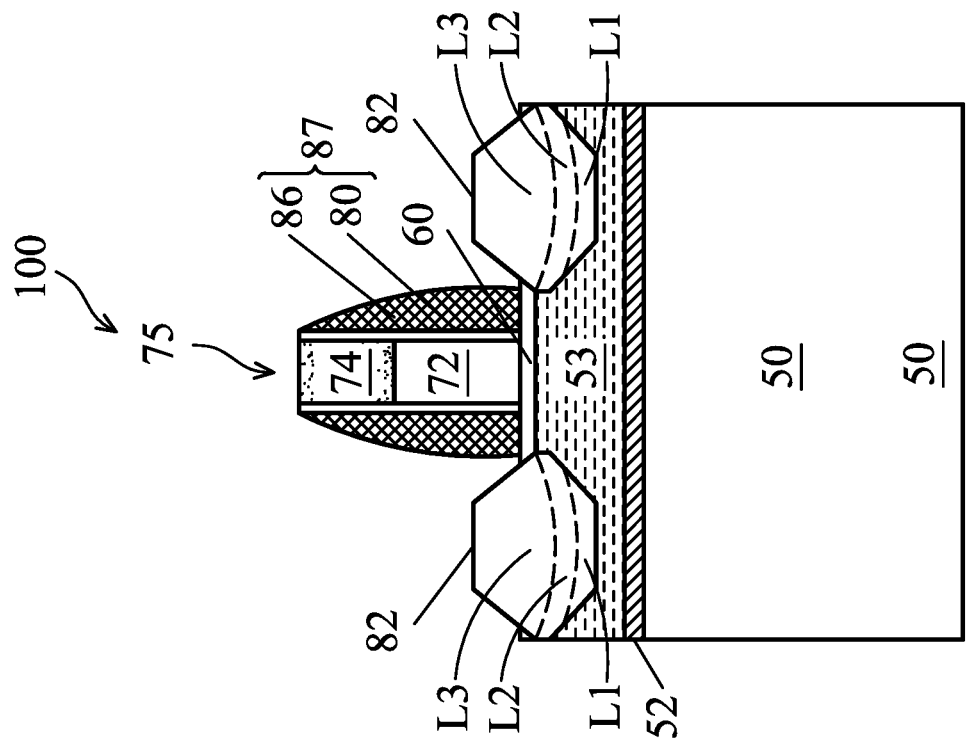
Figure 17A:
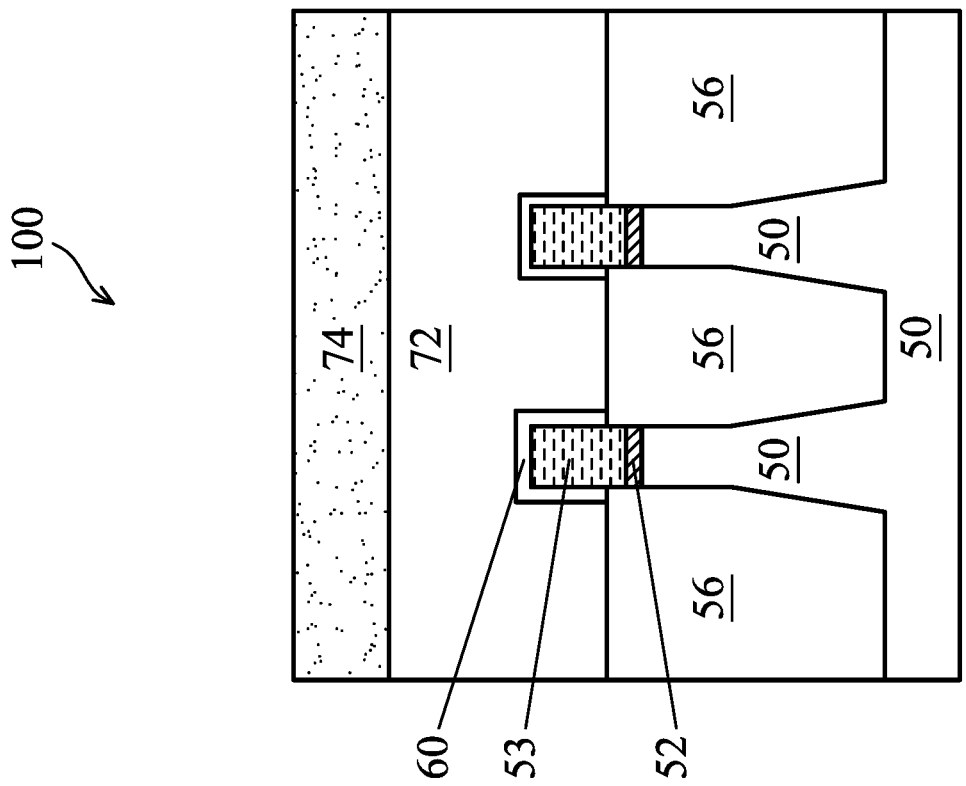
Figure 17C:
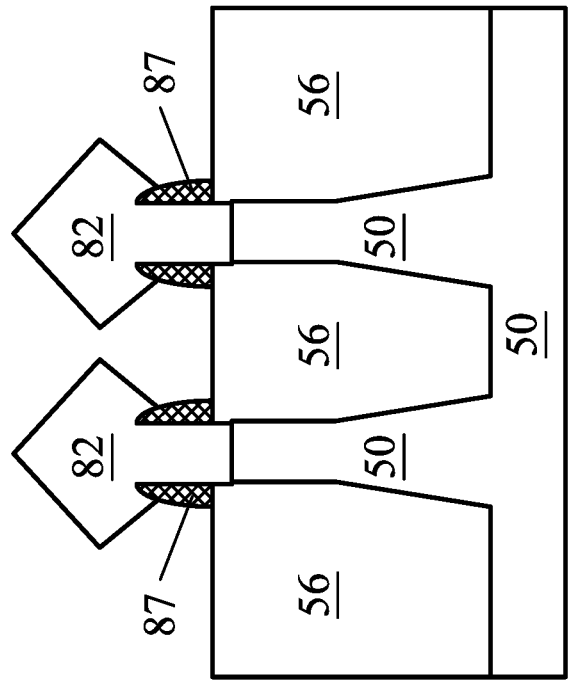
Figure 17D:
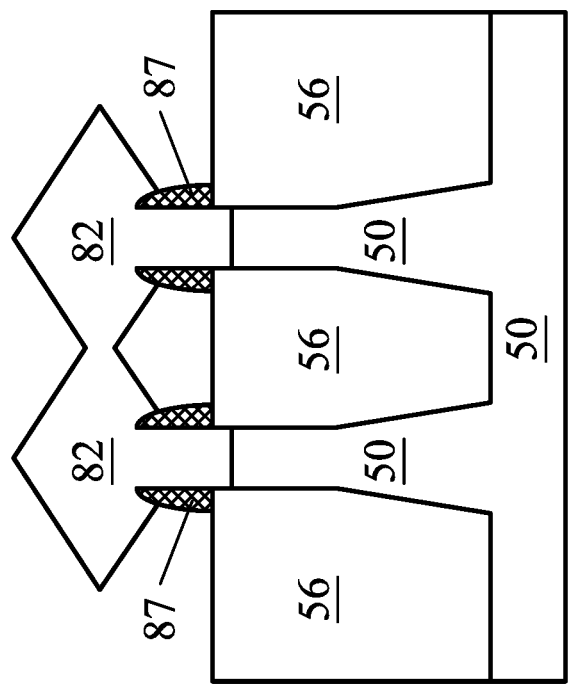

Next, in FIGS. 17A and 17B, epitaxial source/drain regions 82 are formed in the fins 58. The epitaxial source/drain regions 82 are formed in the fins 58 such that the dummy gate structure 75 is disposed between the epitaxial source/drain regions 82. Prior to forming the source/drain regions 82, recesses may be formed in the fins 58 at locations where the epitaxial source/drain regions 82 are to be formed, using, e.g., a patterned mask layer and one or more etching processes. The epitaxial source/drain regions 82 in the region 50B, e.g., the NMOS region, may be formed by masking the region 50C, e.g., the PMOS region, and then, epitaxially growing the source/drain regions 82 in the recesses in the region 50B. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and epitaxially growing source/drain regions 82 in the recesses in the region 50C. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants (e.g., n-type dopant such as phosphorus, or p-type dopant such as boron, antimony) to form source/drain regions, followed by an anneal. The source/drain regions 82 may have an impurity (e.g., dopant) concentration of between about $10^{19}$ cm$^{-3}$ and about $10^{21}$ cm$^{-3}$. The n-type and/or p-type impurities for the source/drain regions 82 may be any of the impurities previously discussed. In some embodiments, the epitaxial source/drain regions 82 may be in situ doped during growth.

In the illustrated embodiment, the source/drain regions 82 in the region 50C (e.g., p-type device region) has three sublayers L1, L2, and L3 with different concentrations of dopant (e.g., boron, antimony). For example, the dopant concentration in the sublayer L1 may be between about $10^{19}$ cm$^{-3}$ and about $10^{20}$ cm$^{-3}$, the dopant concentration in the sublayer L2 may be between about $5\times10^{19}$ cm$^{-3}$ and about $10^{21}$ cm$^{-3}$, and the dopant concentration in the sublayer L3 may be between about $10^{20}$ cm$^{-3}$ and about $2\times10^{21}$ cm$^{-3}$. The thickness of the layer L1 (e.g., measured along the vertical direction of FIG. 17B) may be between about 3 nm and about 15 nm, the thickness of the layer L2 may be between about 40 nm and about 60 nm, and the thickness of the layer L3 may be between about 3 nm and about 15 nm.

The dopant in the source/drain regions 82 of FIG. 17B may diffuse into the channel region of the FinFET device 100. The increased carrier concentration in the channel region (due to dopant diffusion) may reduce the threshold voltage. For various reasons, such as the source/drain regions having different dopant concentrations at different locations (e.g., in layers L1, L2 and L3), the concentration of the diffused dopant in the channel region may be non-uniform, which may result in a non-uniform threshold voltage for the FinFET device 100. As discussed above with reference to FIG. 6, the germanium concentration in the channel region may be tuned in accordance with the concentration of the diffused dopant in the channel region, such that a uniform threshold voltage may be achieved. For example, a lower concentration of germanium may be formed in an area with higher dopant (e.g., boron) concentration, and a higher concentration of germanium may be formed in an area with a lower dopant (e.g., boron) concentration.

Figure 24B:
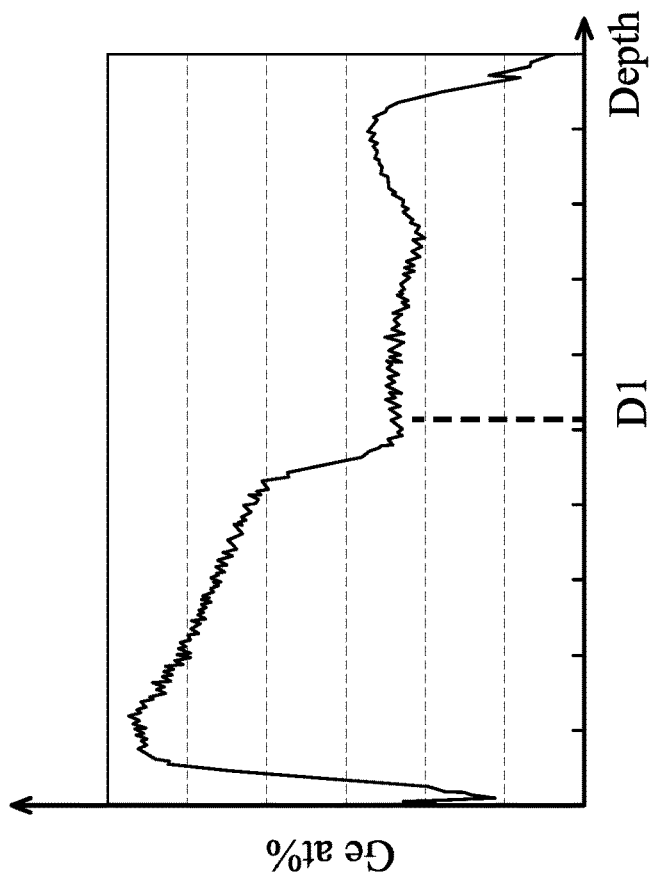
FIGS. 24A and 24B illustrate the concentrations of boron and germanium, respectively, in the channel region of a FinFET device, in an embodiment.
Figure 24A:
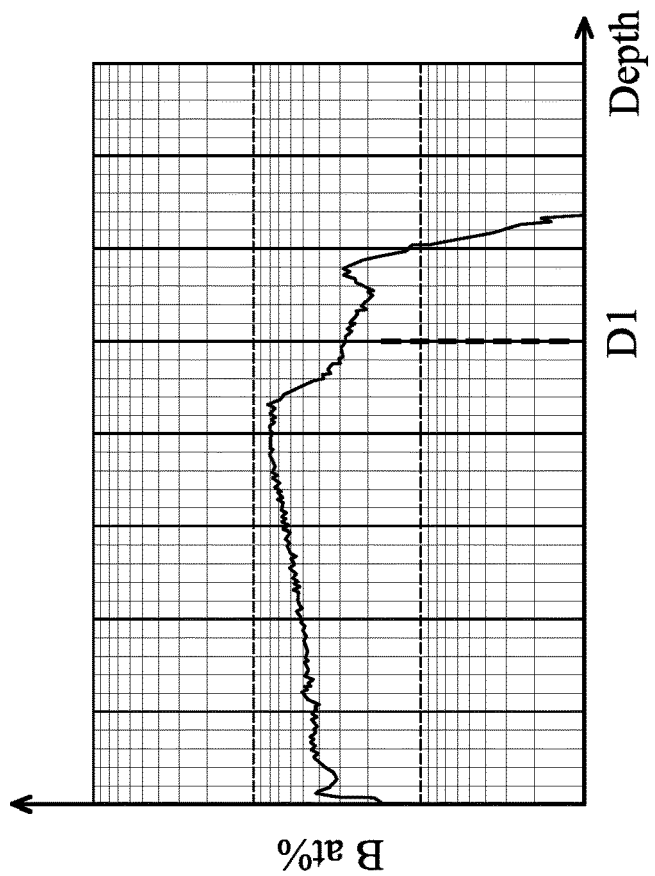

Referring temporarily to FIGS. 24A, 24B, and 25A-25C, FIG. 24A illustrates the concentration of the dopant (e.g., boron) in the source/drain region 82 of an embodiment FinFET device. The y-axis illustrates the dopant concentration, and x-axis illustrates the vertical distance (e.g., depth) from the top of the source/drain region 82. The location D1 corresponds to the depth of the bottom of the source/drain region 82. Locations along the x-axis and to the right side of D1 correspond to portions of the fin under the source/drain region 82. FIG. 24B illustrates the concentration of germanium in the source/drain region 82. Note that the germanium concentration illustrated in FIG. 24B is due to the germanium contained in the material (e.g., SiGe) of the source/drain region 82, and is not the germanium concentration in the channel region of the fin. As illustrated in FIG. 24A, the dopant (e.g., boron) concentration in the source/drain region 82 is non-uniform, which will cause a non-uniform concentration of diffused dopant (e.g., boron) in the channel region of the fin. The effect of the non-uniform diffused dopant (e.g., boron) concentration is balanced out by a non-uniform germanium concentration in the channel region, in some embodiments.

Figures 25A, 25B, 25C:
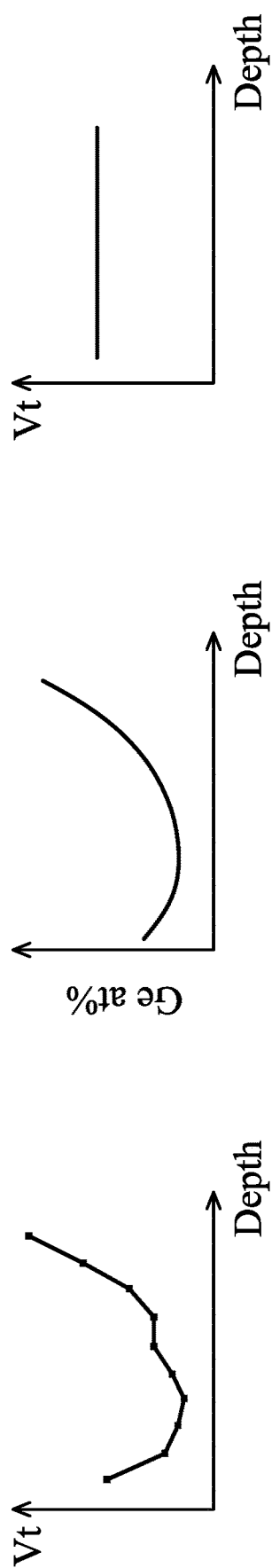
FIG. 25A illustrates the threshold voltage of a FinFET device with boron diffused into the channel region, in an embodiment.
FIG. 25B illustrates the concentration of germanium in the channel region of a FinFET device, in an embodiment.
FIG. 25C illustrates the threshold voltage of a FinFET device with boron diffusion as illustrated in FIG. 25A and with germanium doped into the channel region as illustrated in FIG. 25B, in an embodiment.

FIG. 25A illustrates the simulated threshold voltage Vt of a FinFET device with dopant diffusion. The FinFET device of FIG. 25A does not counteract the effect of the dopant diffusion with a non-uniform germanium concentration in the channel region. In FIG. 25A, the y-axis illustrates the threshold voltage, and the x-axis illustrates the vertical distance (e.g., depth) between the top surface of the fin and the location in the channel region being measured. As illustrated in FIG. 25A, the FinFET device has a non-uniform threshold voltage.

FIG. 25B illustrates the germanium concentration in the channel region of an embodiment FinFET device. The germanium concentration is designed to counteract the effect of the diffused dopant (see FIG. 25A) in the channel region. FIG. 25C illustrates the simulated threshold voltage of the embodiment FinFET device, which shows a uniform threshold voltage.

Referring back to FIGS. 17C and 17D, as a result of the epitaxy processes used to form the epitaxial source/drain regions 82 in the region 50B and the region 50C, upper surfaces of the epitaxial source/drain regions have facets which expand laterally outward beyond sidewalls of the fins 58. In some embodiments, these facets cause adjacent source/drain regions 82 of a same FinFET device to merge as illustrated by FIG. 17C. In other embodiments, adjacent source/drain regions 82 remain separated after the epitaxy process is completed as illustrated by FIG. 17D.

Figure 18B:
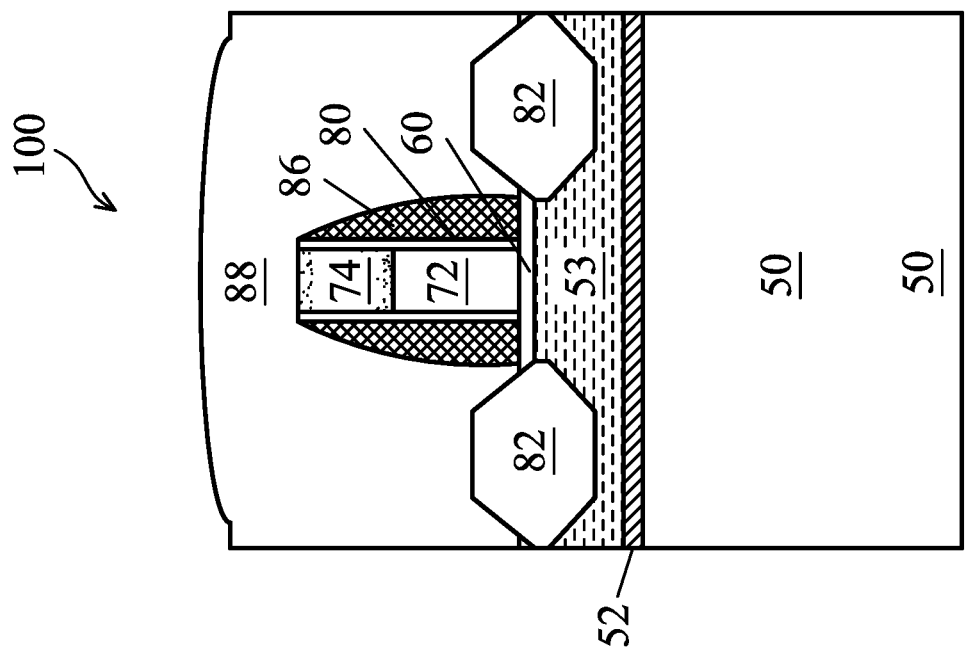
Figure 18A:
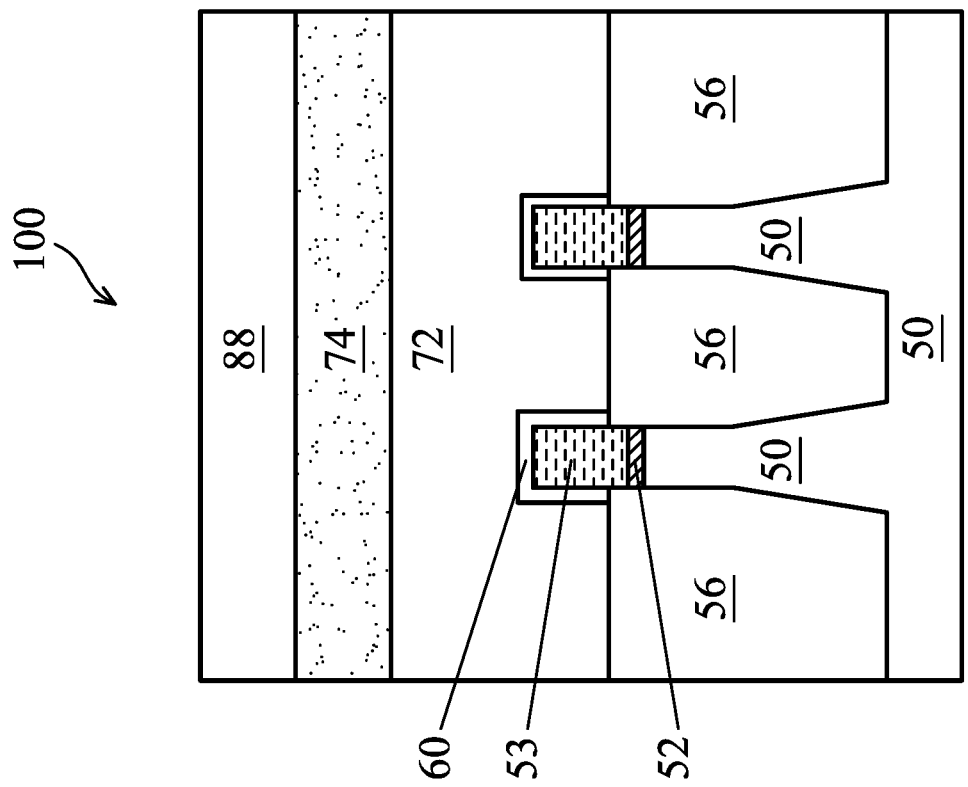

Next, in FIGS. 18A and 18B, an interlayer dielectric (ILD) 88 is deposited over the structure illustrated in FIGS. 17A and 17B. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) (e.g., formed of silicon nitride) is disposed between the ILD 88 and the epitaxial source/drain regions 82, the mask 74, and the gate spacers 87.

Figure 19B:
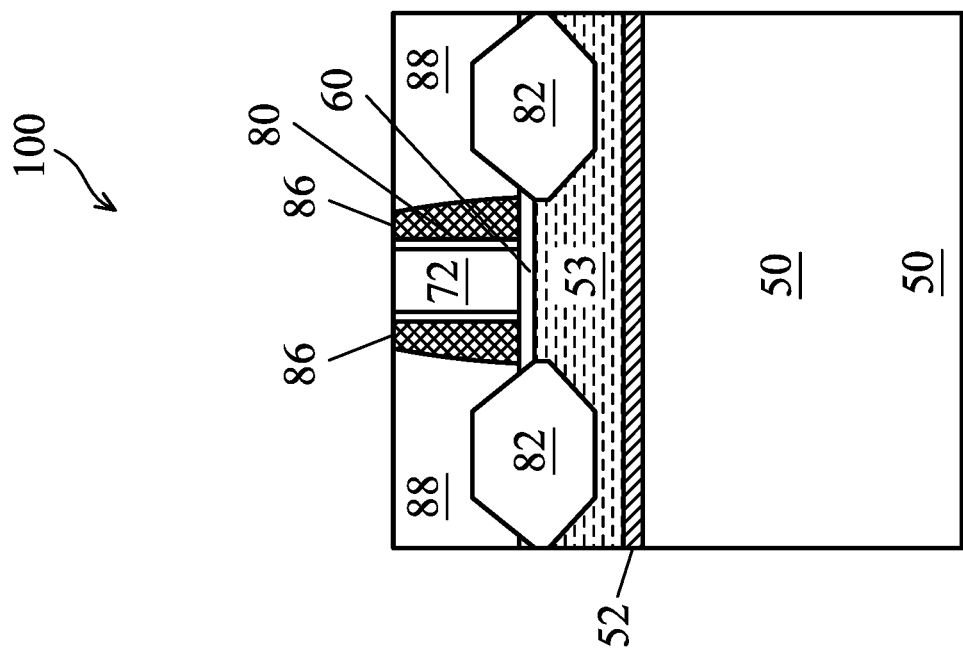
Figure 19A:
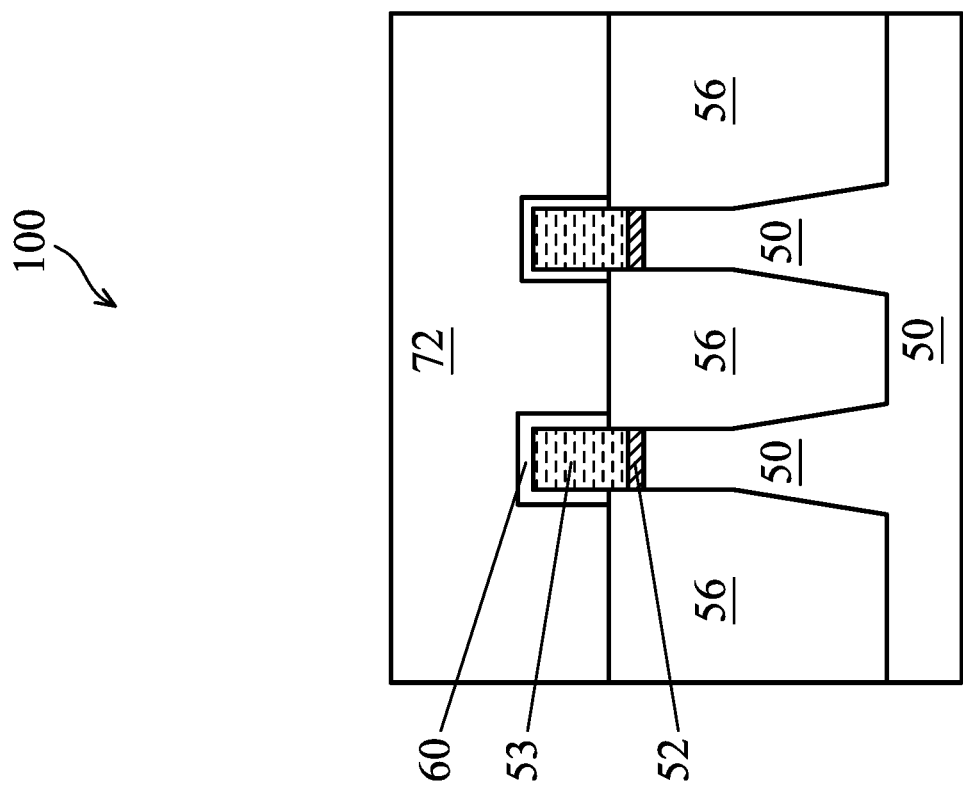

Next, in FIGS. 19A and 19B, a planarization process, such as a CMP, may be performed to level the upper surface of the ILD 88 with the upper surfaces of the dummy gates 72. The planarization process may also remove the masks 74 on the dummy gates 72, and portions of the gate seal spacers 80 and the gate spacers 86 along sidewalls of the masks 74. After the planarization process, upper surfaces of the dummy gates 72, the gate seal spacers 80, the gate spacers 86, and the ILD 88 are level. Accordingly, the upper surfaces of the dummy gates 72 are exposed through the ILD 88.

Figure 20B:
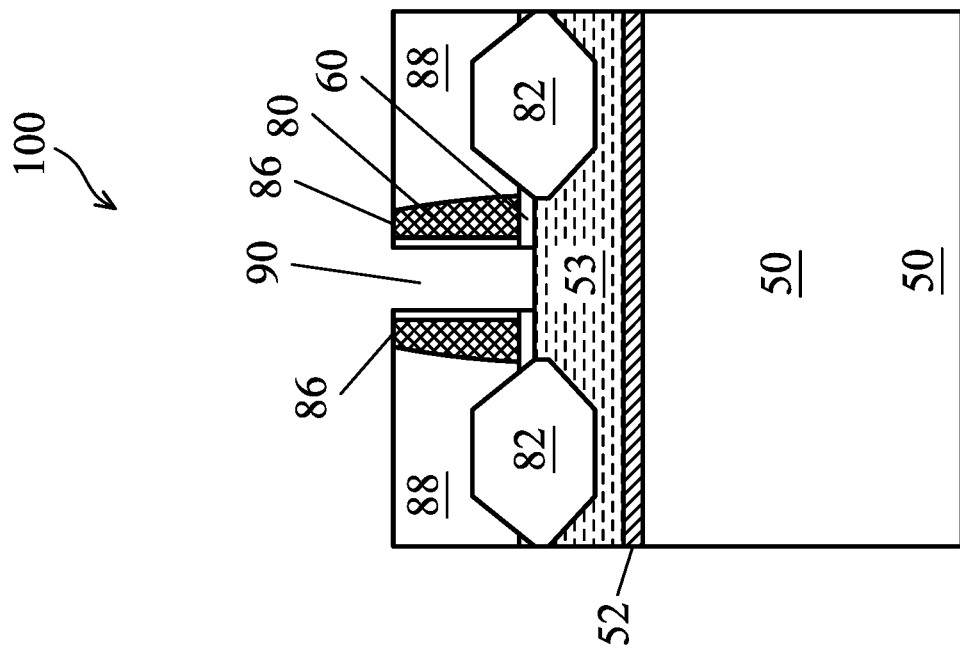
Figure 20A:
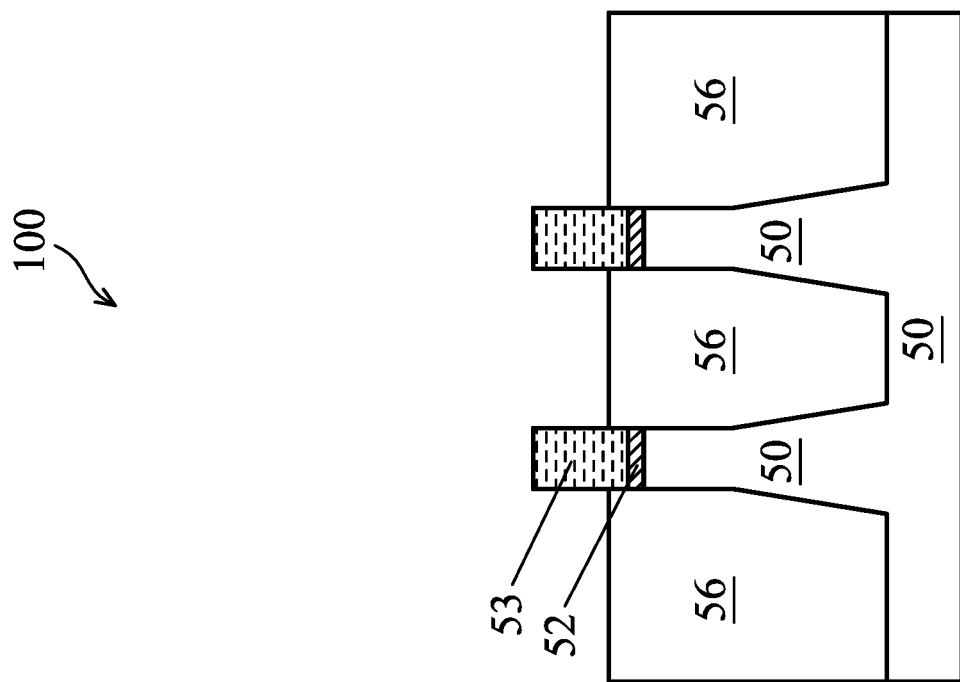

Next, in FIGS. 20A and 20B, the dummy gates 72 and the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 87. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

Figure 21B:
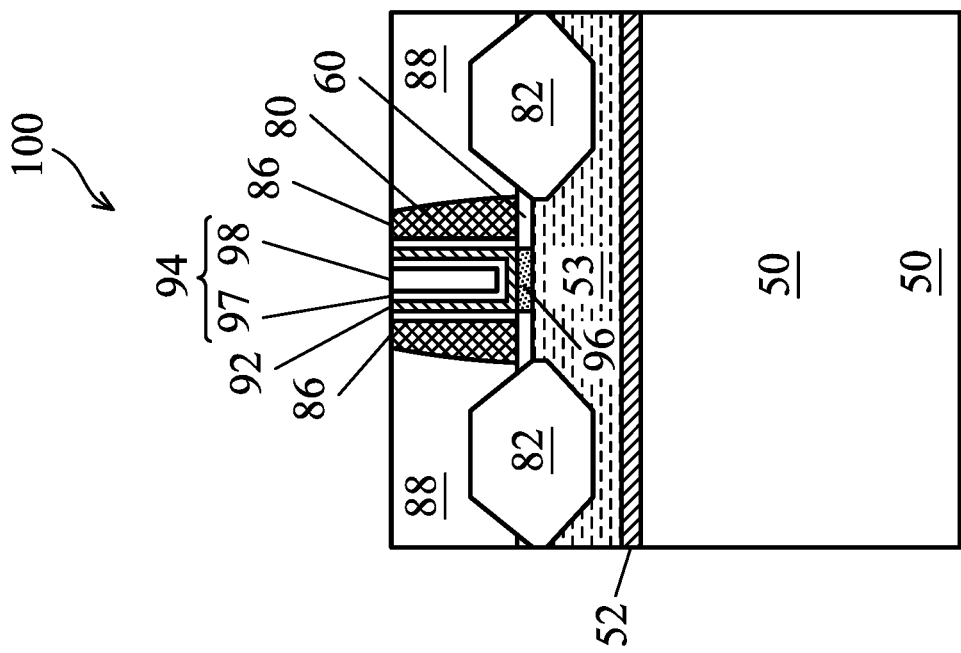
Figure 21A:
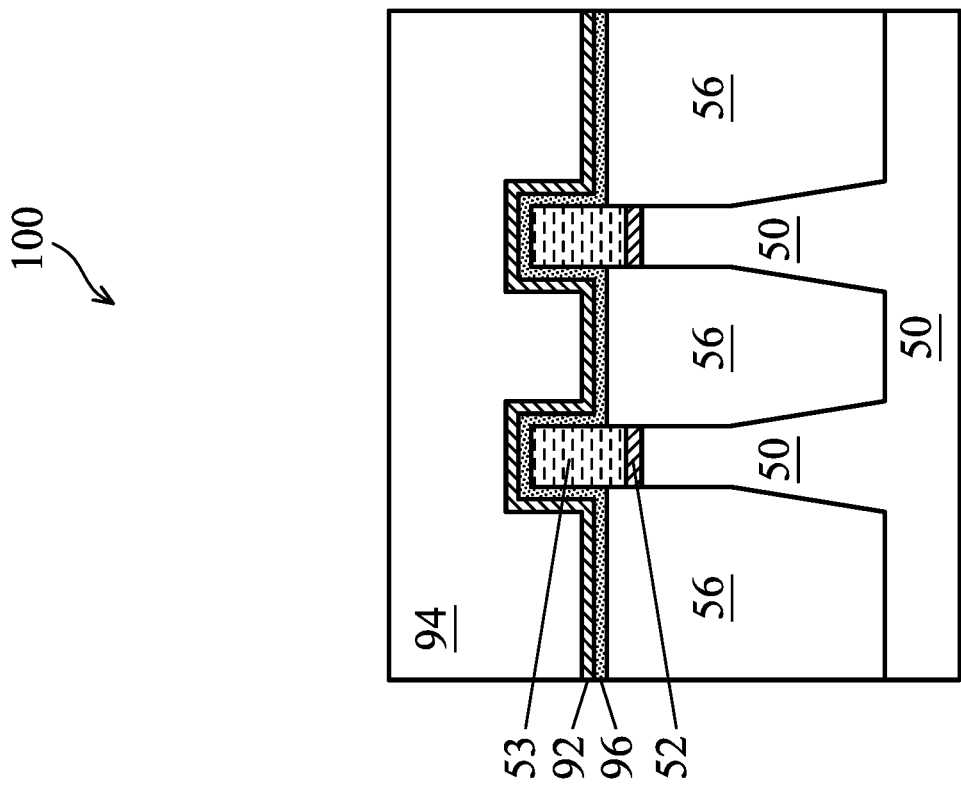

In FIGS. 21A and 21B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In some embodiments, Interfacial Layers (ILs) 96 are formed on the exposed surfaces of fins 58 before the gate dielectric layers 92 are formed. The ILs 96 may include an oxide layer such as a silicon oxide layer, which is formed through a thermal oxidation of the fins 58, a chemical oxidation process, or a deposition process, as examples.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, each of the gate electrodes 94 may include a diffusion barrier layer (not illustrated separately), a work function layer 97 over the diffusion barrier layer, and a fill metal 98 over the work function layer 97. The diffusion barrier layer may be formed of titanium nitride (TiN), which may (or may not) be doped with silicon. The work function layer 97 determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. The material of the work function layer 97 is chosen to tune its work function value so that a target threshold voltage Vt is achieved in the device formed, in some embodiments. After the work function layer 97 is formed, the fill metal 98, which may include any suitable conductive material such as W, Co, Cu, Al, or the like, is formed over the work function layer 97 to fill the recess 90.

After the filling of the fill metal 98, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFET device 100. The gate electrodes 94, the gate dielectric layers 92, and the interfacial layers 96 may be collectively referred to as "gates," "gate stacks," or "gate structures." The gate stacks may each extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 22B:
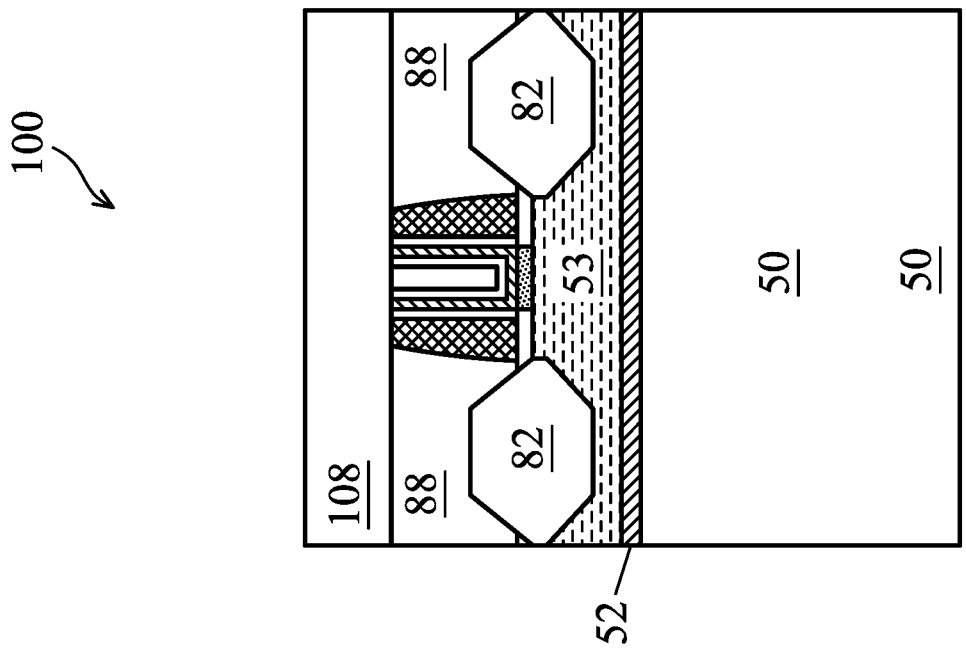
Figure 22A:
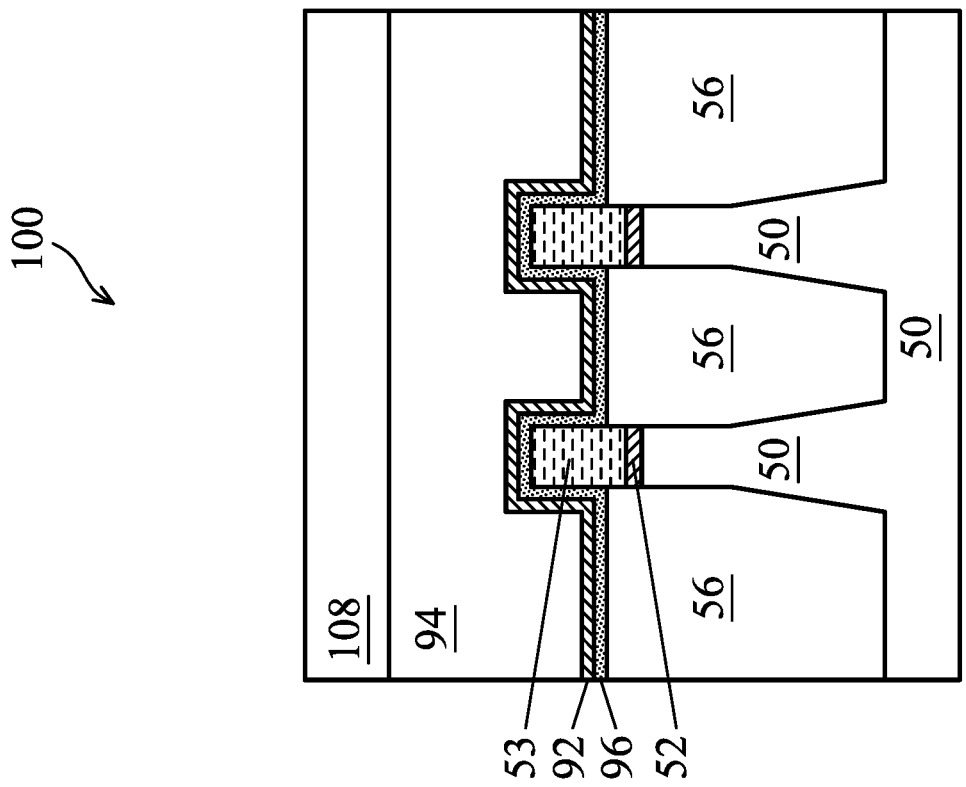

Next, in FIGS. 22A and 22B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 23B:
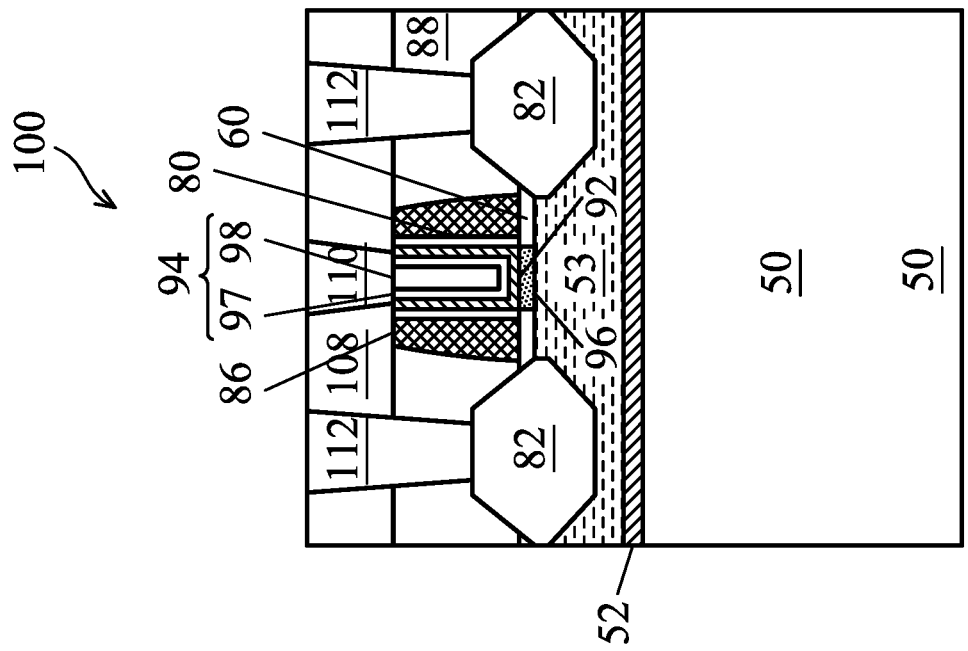
Figure 23A:
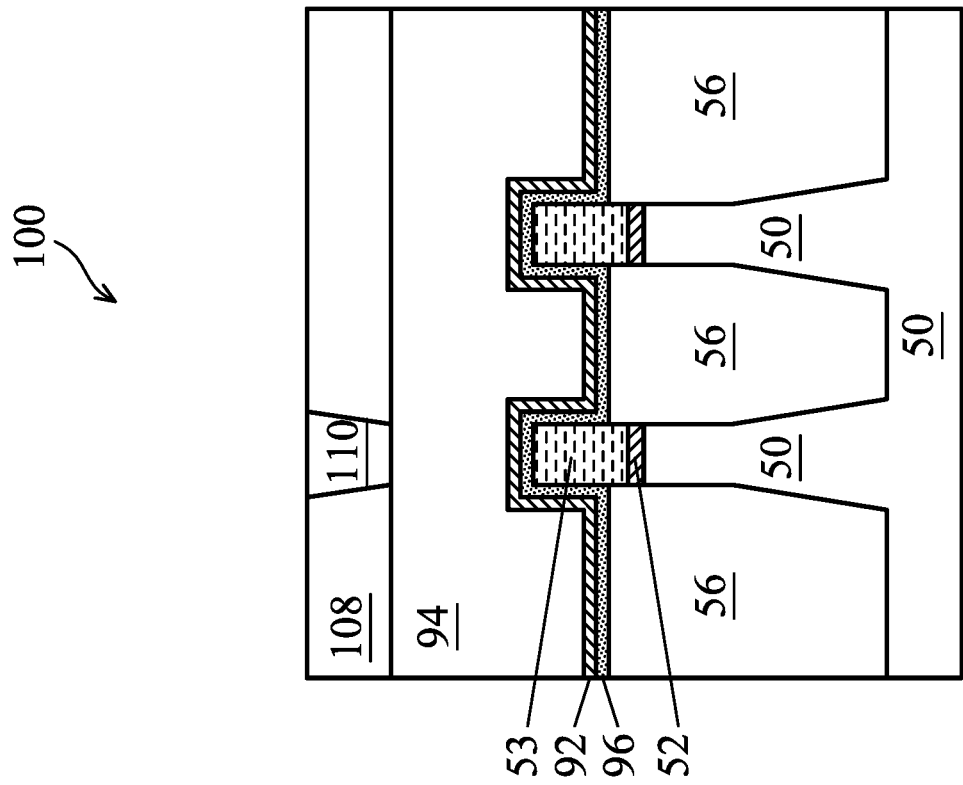

Next, in FIGS. 23A and 23B, contact 110 is formed through the ILD 108 and contacts 112 are formed through the ILDs 88 and 108. In some embodiments, an anneal process may be performed to form a silicide at the interface between the epitaxial source/drain regions 82 and the contacts 112 prior to the contacts 112 being formed. The contact 110 is electrically connected to the gate electrode 94, and the contacts 112 are electrically connected to the epitaxial source/drain regions 82. FIGS. 23A and 23B illustrate the contacts 110 and 112 in a same cross-section; however, in other embodiments, the contacts 110 and 112 may be disposed in different cross-sections. Further, the position of contacts 110 and 112 in FIGS. 23A and 23B are merely illustrative and not intended to be limiting in any way. For example, the contact 110 may be vertically aligned with the fin 58 as illustrated or may be disposed at a different location on the gate electrode 94. Furthermore, the contacts 112 may be formed prior to, simultaneously with, or after forming the contact 110.

Variations to the disclosed embodiments are possible and are fully intended to be included within the scope of the present disclosure. For example, while tuning of the germanium concentration in the channel region is used as an example for p-type FinFET devices, the principle of the present disclosure may be used for n-type FinFET devices. For example, for an n-type FinFET device having fins formed of silicon carbide, the concentration of carbide (e.g., a stress-inducing material for silicon) may be tuned to counteract the effect of the n-type dopant (e.g., phosphorous) diffused into the channel region. In addition, the concentration of germanium in the gradient sublayer C (see, e.g., FIG. 6) of the silicon germanium layer 53 increases from the upper surface of the fin toward the substrate. This is merely a non-limiting example. Depending the profile of the concentration of the diffused dopant (e.g., boron) in the channel region, the concentration of germanium in the gradient sublayer C may decrease from the upper surface of the fin toward the substrate.

Embodiments may achieve advantages. By tuning the concentration of the stress-inducing material in the channel region to counteract the effect of the diffused dopant from the source/drain region into the channel region, a substantially uniform threshold voltage is achieved for the FinFET device formed, and the performance of the FinFET device is improved.

FIG. 26 illustrates a flow chart of a method 1000 of fabricating a semiconductor device, in accordance with some embodiments. It should be understood that the embodiment method shown in FIG. 26 is merely an example of many possible embodiment methods. One of ordinary skill in the art would recognize many variations, alternatives, and modifications. For example, various steps as illustrated in FIG. 26 may be added, removed, replaced, rearranged and repeated.

Referring to FIG. 26, at block 1010, a fin is formed protruding from a substrate, the fin being formed of silicon germanium, wherein a concentration of germanium in the fin varies along a first direction from an upper surface of the fin toward the substrate. At block 1020, a gate structure is formed over a channel region of the fin, wherein a concentration of germanium in the channel region increases from a first location of the channel region to a second location of the channel region, wherein the first location and the second location are aligned along the first direction. At block 1030, a doped source/drain region is formed in the fin and adjacent to the gate, wherein a dopant of the doped source/drain region diffuses into the channel region of fin, where a concentration of the dopant in the channel region varies along the first direction, wherein the concentration of the dopant decreases from the first location of the channel region to the second location of the channel region.

In accordance with an embodiment, a semiconductor device includes a substrate; a fin protruding above the substrate, the fin including a compound semiconductor material that includes a semiconductor material and a first dopant, the first dopant having a different lattice constant than the semiconductor material, where a concentration of the first dopant in the fin changes along a first direction from an upper surface of the fin toward the substrate; a gate structure over the fin; a channel region in the fin and directly under the gate structure; and source/drain regions on opposing sides of the gate structure, the source/drain regions including a second dopant, where a concentration of the second dopant in the channel region changes along the first direction, where the concentration of the second dopant at a first location within the channel region is higher than that at a second location within the channel region, where the concentration of the first dopant at the first location is lower than that at the second location. In an embodiment, the compound semiconductor material is silicon germanium, the semiconductor material is silicon, and the first dopant is germanium. In an embodiment, the channel region includes a first segment, the concentration of the first dopant in the first segment increases along the first direction, and the concentration of the second dopant in the first segment decreases continuously along the first direction. In an embodiment, the semiconductor device further includes a capping layer over the channel region of the fin, where the capping layer is substantially free of the first dopant. In an embodiment, the fin includes a first segment, the concentration of the first dopant in the first segment increases continuously along the first direction. In an embodiment, fin further includes a second segment between the first segment and the substrate, the concentration of the first dopant in the second segment is lower than a lowest concentration of the first dopant in the first segment. In an embodiment, the fin further includes a third segment between the first segment and the second segment, and the concentration of the first dopant in the third segment is uniform. In an embodiment, the concentration of the first dopant in the third segment is substantially equal to a highest concentration of the first dopant in the first segment. In an embodiment, the fin further includes a fourth segment over the first segment, with the first segment between the fourth segment and the third segment, where the concentration of the first dopant in the fourth segment is uniform. In an embodiment, the concentration of the first dopant in the fourth segment is lower than the concentration of the first dopant in the third segment. In an embodiment, the fin includes a buffer layer, a first sublayer over the buffer layer, and a second sublayer over the first sublayer, where the concentration of the first dopant in the first sublayer has a first value, the concentration of the first dopant in the second sublayer has a second value smaller than the first value, where the concentration of the first dopant in the buffer layer has a third value smaller than the second value.

In accordance with an embodiment, a semiconductor device includes a fin over a substrate, the fin including silicon germanium; a gate structure over the fin; a channel region in the fin, the gate structure being disposed over the channel region, a concentration of germanium in the channel region changing along a first direction from an upper surface of the fin distal the substrate to the substrate, where a concentration of germanium increases from a first location of the channel region to a second location of the channel region, where the first location and the second location are aligned along the first direction; and a source/drain region in the fin and adjacent to the gate structure, the source/drain region including a dopant, a concentration of the dopant in the channel region changing along the first direction, where a concentration of the dopant decreases from the first location of the channel region to the second location of the channel region. In an embodiment, the dopant is boron or antimony. In an embodiment, the source/drain region includes a first sublayer, a second sublayer over the first sublayer, and a third sublayer over the second sublayer, where the first sublayer has a first concentration of the dopant, the second sublayer has a second concentration of the dopant, and the third sublayer has a third concentration of the dopant, where the third concentration is higher than the second concentration, and the second concentration is higher than the first concentration. In an embodiment, the fin includes a gradient layer, where the concentration of germanium in the gradient layer increases along the first direction. In an embodiment, the fin further includes a buffer layer between the gradient layer and the substrate, where the concentration of germanium in the buffer layer is lower than the concentration of germanium in the gradient layer.

In accordance with an embodiment, a method includes forming a fin protruding from a substrate, the fin being formed of silicon germanium, where a concentration of germanium in the fin varies along a first direction from an upper surface of the fin toward the substrate; forming a gate over a channel region of the fin, where a concentration of germanium in the channel region increases from a first location of the channel region to a second location of the channel region, where the first location and the second location are aligned along the first direction; and forming a doped source/drain region in the fin and adjacent to the gate, where a dopant of the doped source/drain region diffuses into the channel region of the fin, where a concentration of the dopant in the channel region varies along the first direction, where the concentration of the dopant decreases from the first location of the channel region to the second location of the channel region. In an embodiment, forming the fin includes forming the fin by performing an epitaxy process using a plurality of precursors, where a mixing ratio of the plurality of precursors are varied during the epitaxy process to change the concentration of germanium along the first direction in the fin. In an embodiment, forming the fin includes forming a gradient layer of the fin by an epitaxy process using a plurality of precursors, where the concentration of germanium in the gradient layer increases along the first direction, where during the epitaxy process, a mixing ratio of the plurality of precursors is fixed, and a temperature of the epitaxy process is increased from a first temperature to a second temperature. In an embodiment, the concentration of germanium in the fin is formed in accordance with the concentration of the diffused dopant in a channel region of the fin to achieve a uniform threshold voltage along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a fin protruding above the substrate, the fin comprising a semiconductor material and a first dopant, wherein a concentration of the first dopant in the fin changes along a first direction from an upper surface of the fin toward the substrate;
a gate structure over a channel region in the fin; and
source/drain regions on opposing sides of the gate structure, the source/drain regions comprising a second dopant that diffuses into the channel region, wherein a concentration of the second dopant changes along the first direction, wherein the concentration of the second dopant at a first location within the channel region is higher than that at a second location within the channel region, wherein the concentration of the first dopant at the first location is lower than that at the second location.

2. The semiconductor device of claim 1, wherein the semiconductor material is silicon, and the first dopant is germanium.

3. The semiconductor device of claim 2, wherein the second dopant is a p-type dopant.

4. The semiconductor device of claim 1, wherein the channel region comprises a gradient layer, wherein the first location and the second location are in the gradient layer, wherein the concentration of the first dopant in the gradient layer increases along the first direction, and the concentration of the second dopant in the gradient layer decreases along the first direction.

5. The semiconductor device of claim 4, further comprising a capping layer over the channel region of the fin, wherein the capping layer is between the gate structure and the fin, and is substantially free of the first dopant.

6. The semiconductor device of claim 4, wherein the channel region further comprises a buffer layer disposed between the gradient layer and the substrate, wherein a concentration of the first dopant in the buffer layer is lower than a lowest concentration of the gradient layer.

7. The semiconductor device of claim 6, wherein the channel region further comprises a first segment between the gradient layer and the buffer layer, wherein a concentration of the first dopant in the first segment is uniform.

8. The semiconductor device of claim 7, wherein the concentration of the first dopant in the first segment is equal to a highest concentration of the first dopant in the gradient layer.

9. The semiconductor device of claim 7, wherein the channel region further comprises a second segment between the gradient layer and the gate structure, wherein a concentration of the first dopant in the second segment is uniform.

10. The semiconductor device of claim 9, wherein the concentration of the first dopant in the second segment is equal to a lowest concentration of the first dopant in the gradient layer.

11. A semiconductor device comprising:
a fin over a substrate, the fin comprising silicon germanium;
a gate structure over a channel region in the fin, wherein a concentration of germanium in the channel region increases from a first location of the channel region to a second location of the channel region, wherein the first location and the second location are aligned along a first direction from an upper surface of the fin distal from the substrate to the substrate; and
a source/drain region in the fin and adjacent to the gate structure, the source/drain region comprising a dopant that diffuses into the channel region, wherein a concentration of the dopant decreases from the first location of the channel region to the second location of the channel region.

12. The semiconductor device of claim 11, wherein the dopant is boron or antimony.

13. The semiconductor device of claim 11, wherein the fin comprises a gradient layer that includes the first location and the second location, wherein the concentration of germanium in the gradient layer increases along the first direction.

14. The semiconductor device of claim 13, wherein the concentration of the dopant in the gradient layer decreases along the first direction.

15. The semiconductor device of claim 13, wherein the fin further comprises a buffer layer between the gradient layer and the substrate, wherein the concentration of germanium in the buffer layer is uniform, and is lower than the concentration of germanium in the gradient layer.

16. The semiconductor device of claim 11, wherein the source/drain region comprises a first sublayer, a second sublayer over the first sublayer, and a third sublayer over the second sublayer, wherein the first sublayer has a first concentration of the dopant, the second sublayer has a second concentration of the dopant, and the third sublayer has a third concentration of the dopant, wherein the third concentration is higher than the second concentration, and the second concentration is higher than the first concentration.

17. A semiconductor device comprising:
- a fin protruding from a substrate, the fin comprising silicon germanium, wherein a concentration of germanium in the fin varies along a first direction from an upper surface of the fin toward the substrate;
- a gate over a channel region of the fin, wherein a concentration of germanium in the channel region increases from a first location of the channel region to a second location of the channel region, wherein the first location and the second location are aligned along the first direction; and
- a source/drain region in the fin and adjacent to the gate, wherein the source/drain region comprises a P-type dopant that diffuses into the channel region of the fin, wherein a concentration of the P-type dopant in the channel region decreases from the first location of the channel region to the second location of the channel region.

18. The semiconductor device of claim 17, wherein the channel region of the fin between the first location and the second location forms a gradient segment of the channel region, wherein the channel region of the fin further comprises a first segment between the gradient segment and the substrate, wherein a first concentration of germanium in the first segment is uniform.

19. The semiconductor device of claim 18, wherein the channel region of the fin further comprises a second segment between the first segment and the gradient segment, wherein a second concentration of germanium in the second segment is uniform, and is higher than the first concentration of germanium in the first segment.

20. The semiconductor device of claim 19, wherein the channel region of the fin further comprises a third segment over the gradient segment between the gradient segment and the gate, wherein a third concentration of germanium in the third segment is uniform, and is lower than the second concentration of germanium in the second segment.

* * * * *